(12) United States Patent
Chitaka

(10) Patent No.: US 11,303,013 B2
(45) Date of Patent: Apr. 12, 2022

(54) VEHICULAR ANTENNA DEVICE

(71) Applicant: DENSO CORPORATION, Kariya (JP)

(72) Inventor: Hiroki Chitaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/000,883

(22) Filed: Aug. 24, 2020

(65) Prior Publication Data

US 2020/0388910 A1 Dec. 10, 2020

Related U.S. Application Data

(63) Continuation of application No. PCT/JP2018/045893, filed on Dec. 13, 2018.

(30) Foreign Application Priority Data

Feb. 26, 2018 (JP) .............................. JP2018-031945

(51) Int. Cl.
*H01Q 1/32* (2006.01)
*H01Q 1/12* (2006.01)
*H01Q 1/42* (2006.01)
*H05K 1/02* (2006.01)

(52) U.S. Cl.
CPC .......... *H01Q 1/3275* (2013.01); *H01Q 1/1214* (2013.01); *H01Q 1/42* (2013.01); *H05K 1/0203* (2013.01)

(58) Field of Classification Search
CPC ...... H01Q 1/3275; H01Q 1/1214; H01Q 1/42; H01Q 1/02; H05K 1/0212; H05K 1/0203; H05K 1/0209
See application file for complete search history.

(56) References Cited

U.S. PATENT DOCUMENTS

| | | | | |
|---|---|---|---|---|
| 5,451,970 A | * | 9/1995 | Cole | ......................... G01S 7/03 343/786 |
| 6,028,555 A | | 2/2000 | Harano | |
| 6,225,956 B1 | * | 5/2001 | Bradley | ............... B60Q 1/2657 340/479 |
| 8,302,550 B1 | * | 11/2012 | Woods | .................... G09F 21/04 116/28 R |
| 11,133,579 B2 | * | 9/2021 | Sonozaki | ............. C08G 63/065 |

(Continued)

FOREIGN PATENT DOCUMENTS

| | | |
|---|---|---|
| JP | H10190331 A | 7/1998 |
| JP | H11289182 A | 10/1999 |

(Continued)

*Primary Examiner* — Lam T Mai
(74) *Attorney, Agent, or Firm* — Harness, Dickey & Pierce, P.L.C.

(57) ABSTRACT

A vehicular antenna device includes an antenna portion having an antenna element, and a frame accommodating a heat generation member. The vehicular antenna device is configured to be attached to an attachment portion of a vehicle. The frame includes a first space portion having a cylindrical shape and defining a first space, the first space portion being exposed to an outside air in a condition where the vehicular antenna device is attached to the vehicle. The heat generation member is located along a second surface of the frame that is a reverse side of a first surface defining the first space. The antenna portion is detachable from the frame.

6 Claims, 23 Drawing Sheets

(56) References Cited

U.S. PATENT DOCUMENTS

| | | | |
|---|---|---|---|
| 2008/0076512 A1* | 3/2008 | Aida | G07F 17/3239 |
| | | | 463/20 |
| 2008/0152491 A1 | 6/2008 | Davies | |
| 2012/0050957 A1 | 3/2012 | Pruszenski | |
| 2012/0223862 A1* | 9/2012 | Kerselaers | H01Q 1/3275 |
| | | | 343/700 MS |
| 2012/0319917 A1* | 12/2012 | Kang | H01Q 9/0428 |
| | | | 343/848 |
| 2012/0326935 A1* | 12/2012 | Kang | H01Q 11/08 |
| | | | 343/713 |
| 2013/0141297 A1* | 6/2013 | Gomme | H01Q 5/371 |
| | | | 343/770 |
| 2014/0062808 A1* | 3/2014 | Kataoka | H01Q 1/3275 |
| | | | 343/713 |
| 2015/0229020 A1 | 8/2015 | Sugimoto et al. | |
| 2015/0229021 A1 | 8/2015 | Yukizaki et al. | |
| 2016/0020512 A1* | 1/2016 | Pinney | H01Q 1/42 |
| | | | 343/705 |
| 2017/0054204 A1* | 2/2017 | Changalvala | H01Q 1/2291 |
| 2017/0179584 A1 | 6/2017 | Nakada et al. | |
| 2017/0317407 A1* | 11/2017 | Yasin | H01Q 1/42 |
| 2017/0317408 A1* | 11/2017 | Hamada | B60R 13/0212 |
| 2017/0358836 A1* | 12/2017 | Stratis | H01Q 1/42 |
| 2019/0393590 A1* | 12/2019 | Choi | H01Q 1/3208 |
| 2020/0028249 A1* | 1/2020 | Terashita | H01Q 1/521 |
| 2020/0194877 A1* | 6/2020 | Choi | H01Q 1/42 |
| 2020/0295443 A1* | 9/2020 | Sonozaki | H01Q 1/3275 |
| 2021/0050655 A1* | 2/2021 | Miura | H01Q 1/3275 |
| 2021/0075095 A1* | 3/2021 | Terashita | H01Q 1/3275 |
| 2021/0098884 A1* | 4/2021 | Kobayashi | H01Q 9/0414 |

FOREIGN PATENT DOCUMENTS

| | | |
|---|---|---|
| JP | 3038706 B2 | 5/2000 |
| JP | 2003304109 A | 10/2003 |
| JP | 2008085386 A | 4/2008 |
| JP | 2014050029 A | 3/2014 |
| JP | 2014050030 A | 3/2014 |
| JP | 2014050031 A | 3/2014 |
| JP | 2015154104 A | 8/2015 |
| JP | 2017152810 A | 8/2017 |
| WO | WO-2008079199 A1 | 7/2008 |

\* cited by examiner

FIG. 9
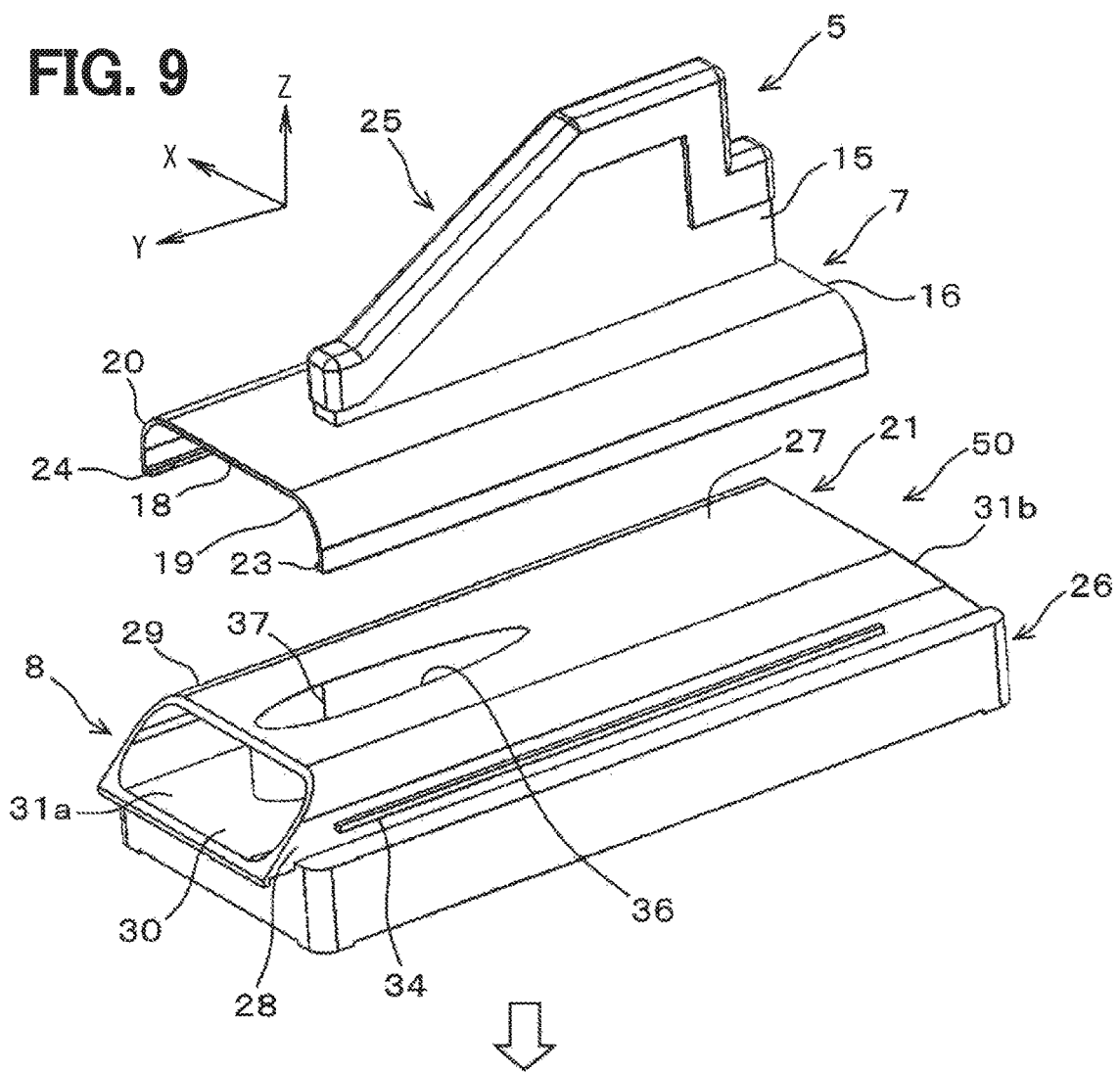
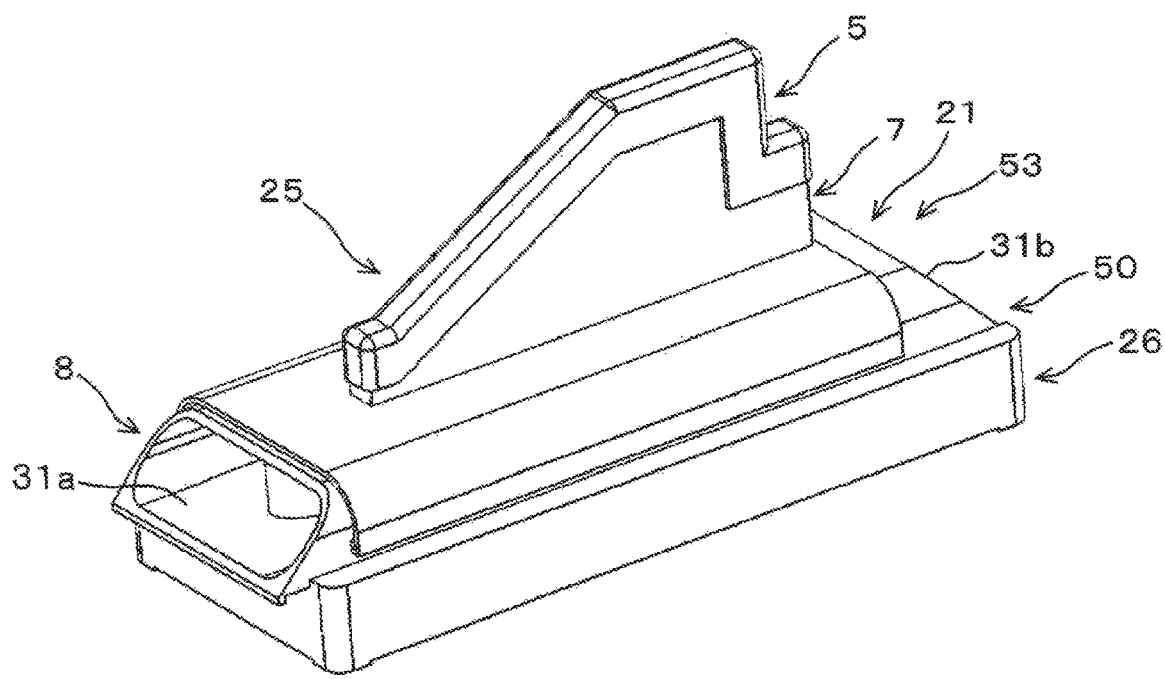

FIG. 10
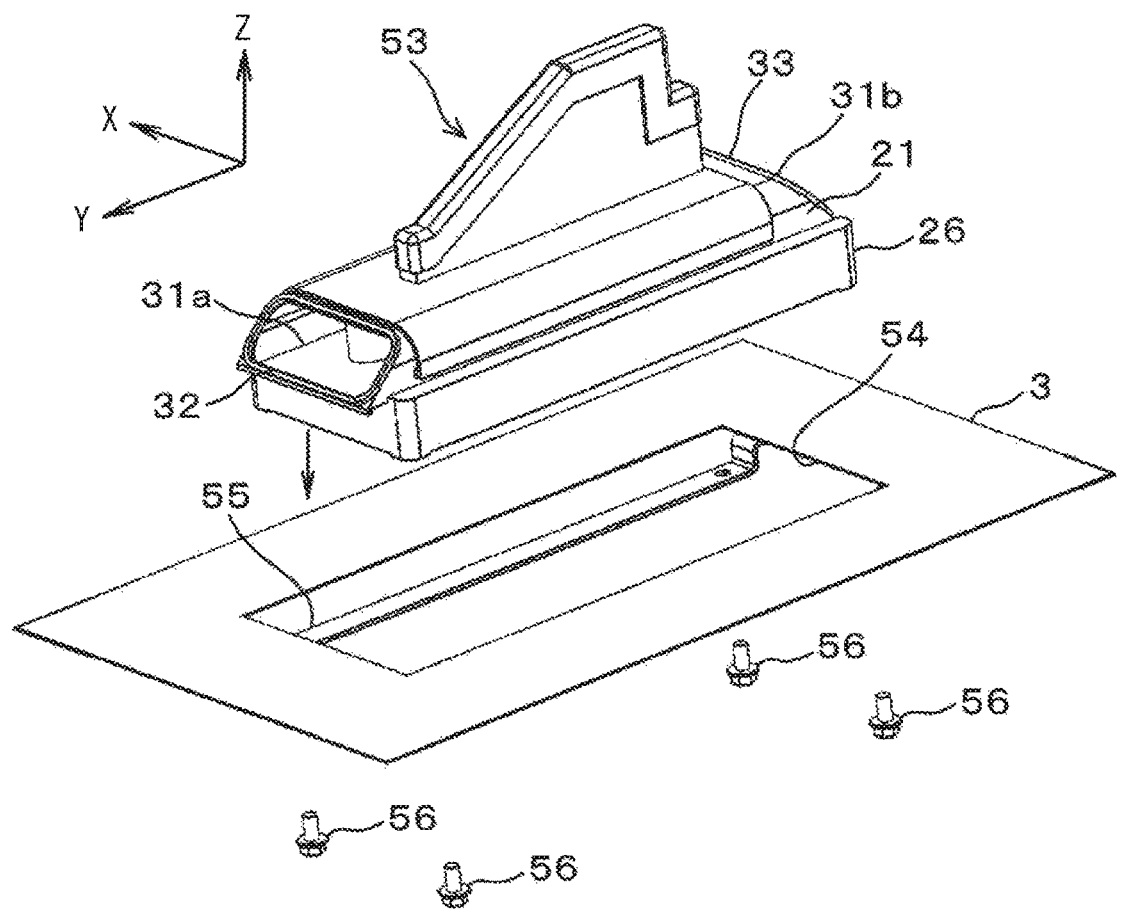
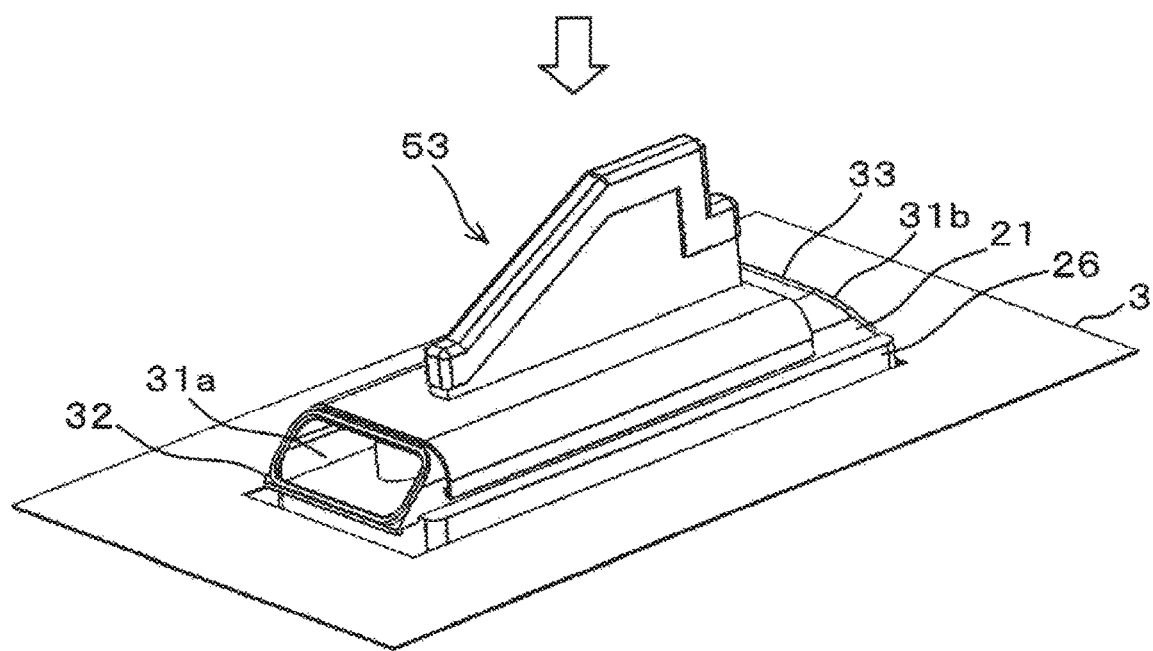

VEHICULAR ANTENNA DEVICE

CROSS REFERENCE TO RELATED APPLICATION

The present application is a continuation application of International Patent Application No. PCT/JP2018/045893 filed on Dec. 13, 2018, which designated the U.S. and claims the benefit of priority from Japanese Patent Application No. 2018-031945 filed on Feb. 26, 2018. The entire disclosures of all of the above applications are incorporated herein by reference.

TECHNICAL FIELD

The present disclosure relates to a vehicular antenna device.

BACKGROUND

There is provided a vehicular antenna device configured to be attached to a roof of a vehicle. This type of vehicular antenna device has a closed structure in which heat generating components are sealed inside a body. The heat generating component is a wireless communication module in which wireless communication circuits are integrated, for example.

SUMMARY

According to an aspect of the present disclosure, a vehicular antenna device includes an antenna portion having an antenna element, and a frame accommodating a heat generation member. The vehicular antenna device is configured to be attached to an attachment portion of a vehicle. The frame includes a first space portion having a cylindrical shape and defining a first space. The first space portion is exposed to an outside air in a condition where the vehicular antenna device is attached to the vehicle. The heat generation member is located along a second surface of the frame that is a reverse side of a first surface defining the first space.

BRIEF DESCRIPTION OF THE DRAWINGS

The above and other objects, features and advantages of the present disclosure will become more apparent from the following detailed description taken in conjunction with the accompanying drawings. In the drawings:

FIG. 9 is a perspective view illustrating the antenna unit, the frame unit, and a body unit;

FIG. 10 is a perspective view showing a procedure for attaching the body unit to a roof of a vehicle;

EMBODIMENTS

Comparative Example

There is provided a vehicular antenna device configured to be attached to a roof of a vehicle. This type of vehicular antenna device has a closed structure in which heat generating components are sealed inside a body. The heat generating component is a wireless communication module in which wireless communication circuits are integrated, for example. In the structure in which the heat generation member is sealed inside the body, the temperature of the inside of the body tends to be high due to the solar radiation in fine weather. Moreover, since the airflow is unlikely to be generated around the body during the vehicle stops, the temperature of the inside of the body is likely to become higher. When the temperature of the inside of the body becomes high, heat dissipation from the heat generation member is obstructed, and accordingly the performance may decrease due to the deterioration of the processing capability of the wireless communication circuit. Further, since the heat generation member has been multi-functionalized by adding functions such as vehicle-to-vehicle communication and the vehicle-to-infrastructure communication in recent years, the heat generation amount from the heat generation member is increasing, and accordingly the temperature of the inside of the body is further likely to become high. Under such circumstances, heat dissipation from the heat generation member is one of big problems. In a comparative example of the present disclosure, a heat dissipation portion is disposed outside body.

In the configuration of the comparative example, the heat generation member disposed inside the body is connected to the heat dissipation portion disposed outside the body through the bracket, and the heat generated by the heat generation member is transferred to the heat dissipation portion through the bracket.

In the configuration of the comparative example, a part extending from the inside of the body to the outside of the body is small. Accordingly, the cross-sectional area for heat conduction is small, and a part of the heat conduction path from the heat generation member to the heat dissipation portion may have a large thermal resistance. Further, since the heat dissipation portion is located on a lateral surface or a rear surface outside the body, the heat conduction path is long. That is, since a part of the heat conduction path has a large thermal resistance or the heat conduction path is long, the heat of the heat generation member may not be released appropriately.

Hereinafter, multiple embodiments will be described with reference to the drawings. Descriptions common throughout the multiple embodiments may be omitted, and the remaining parts will be described.

First Embodiment

Figure 1:
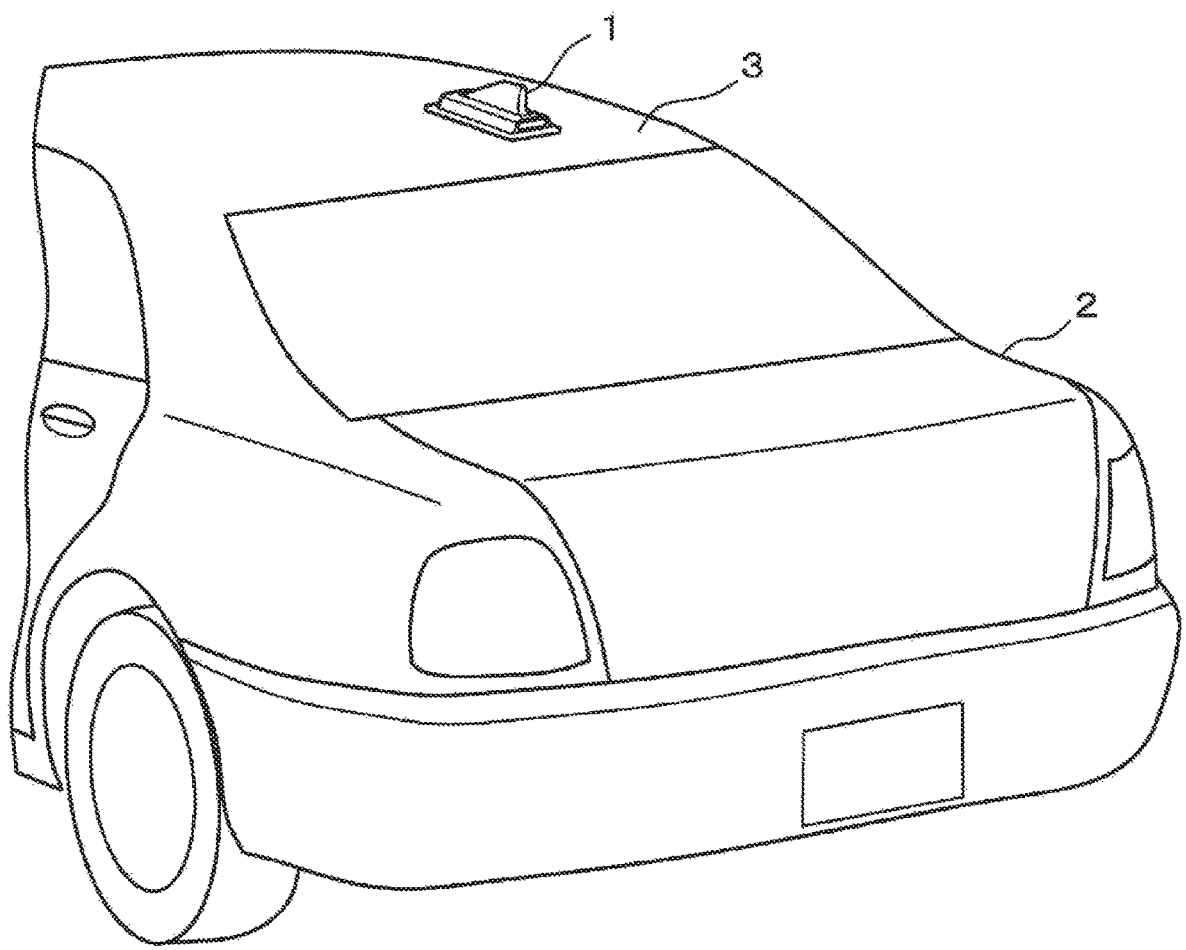
FIG. 1 is a diagram illustrating a situation where a device is attached to a vehicle according to a first embodiment.

A first embodiment will be described with reference to FIGS. 1-19. As shown in FIG. 1, a vehicular antenna device 1 is an antenna device having a streamlined shape like a shark fin to reduce air resistance when a vehicle is travelling. The vehicular antenna device 1 is attached to a rear part of a roof 3 (an attachment portion) such that a longitudinal direction of the vehicular antenna device 1 coincides with a longitudinal direction of a vehicle 2. When the roof 3 of the vehicle 2 gradually lowers from a center part to a rear end and the vehicular antenna device 1 is attached to the lowering part, the vehicular antenna device 1 is not arranged to be along the horizontal direction but inclined such that the rear side is slightly lower than the front side. The vehicular antenna device 1 may be installed as a standard equipment before the vehicle 2 is shipped, or may be installed after the vehicle 2 is shipped.

Figure 2:
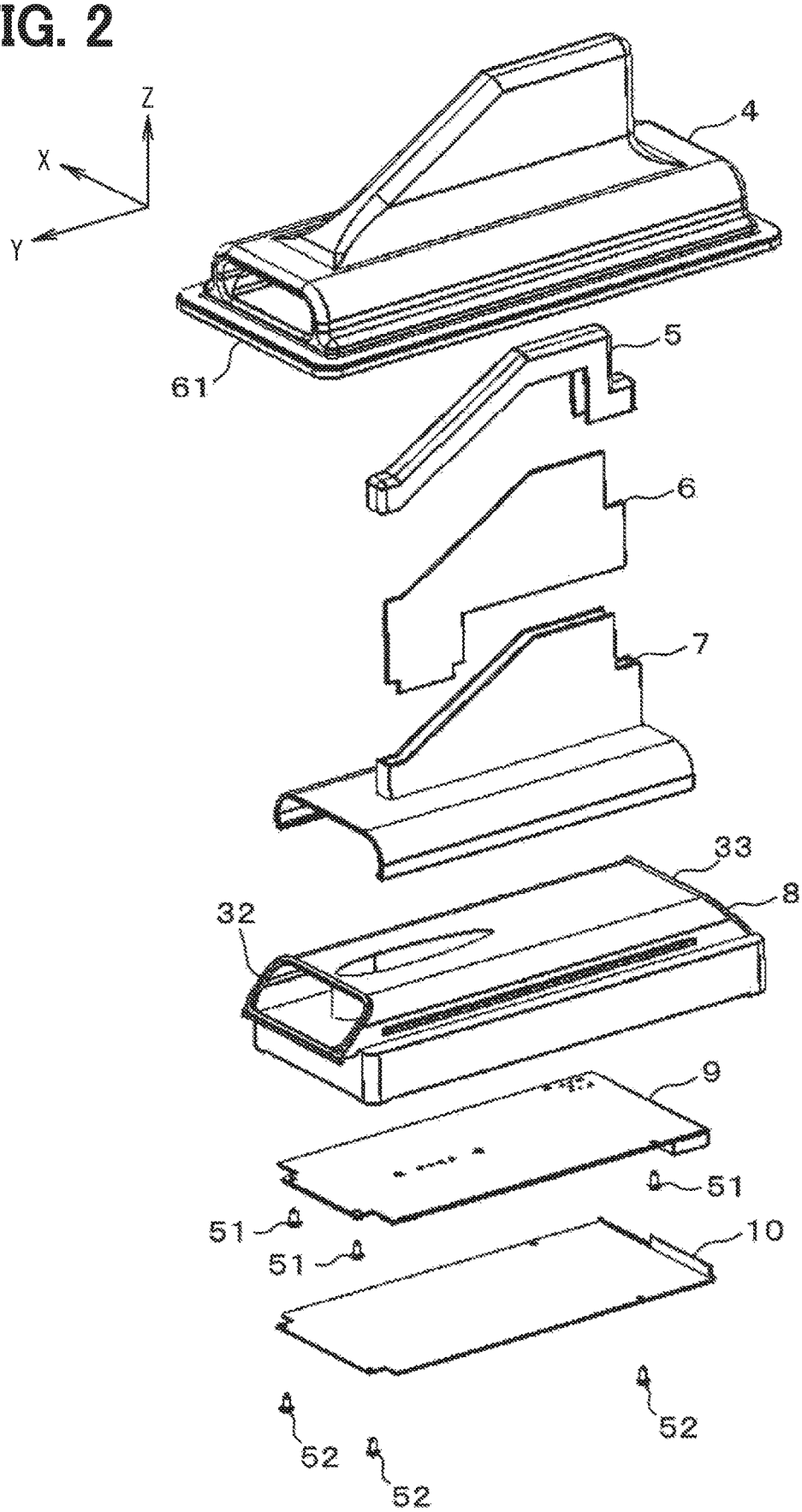
FIG. 2 is a perspective view of components viewed from above.
Figure 3:
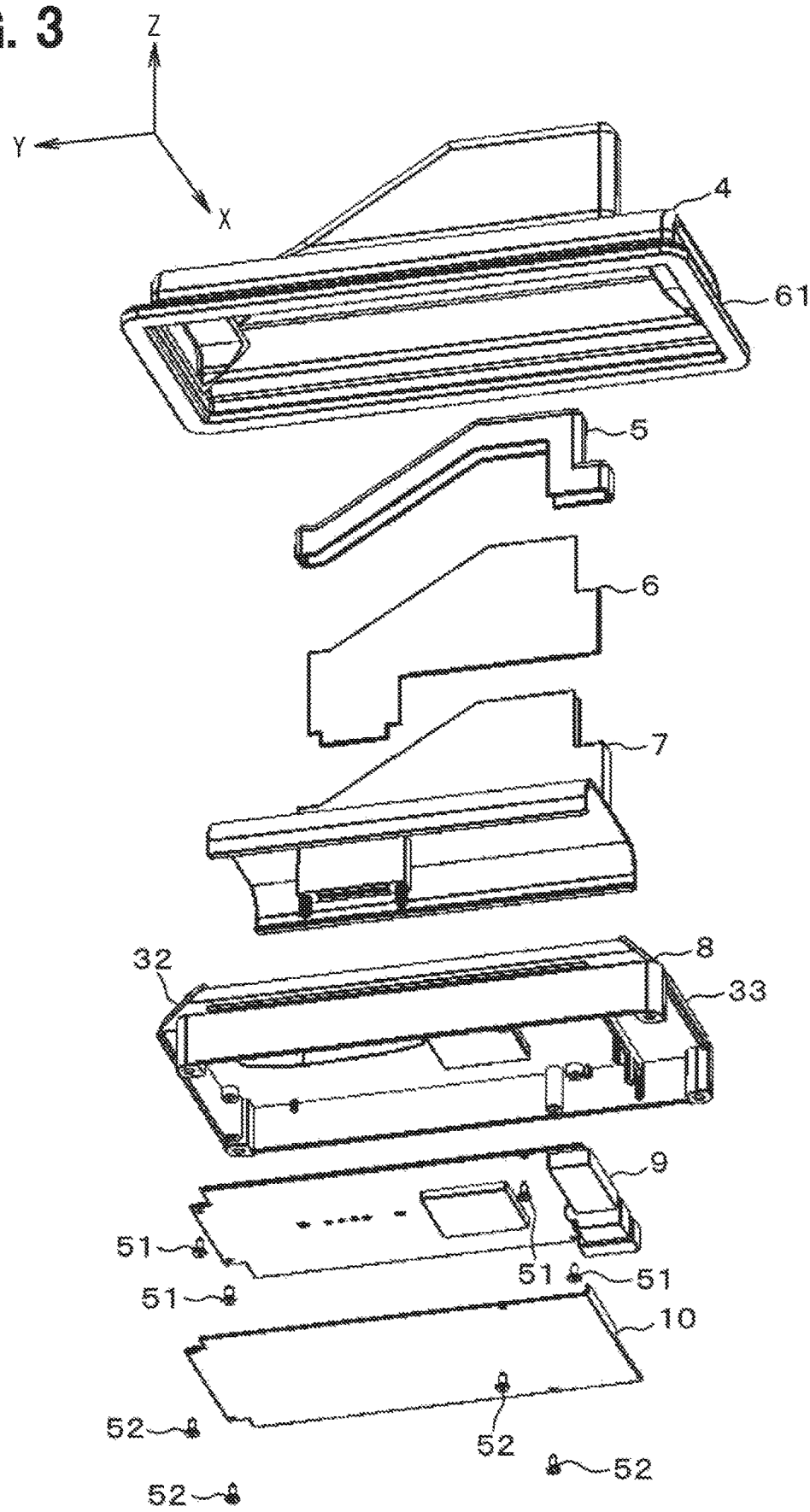
FIG. 3 is a perspective view of components viewed from below.

As shown in FIGS. 2-3, the vehicular antenna device 1 includes a body cover 4, a first fixation member 5, an antenna substrate 6 (an antenna portion), a second fixation member 7, a frame 8, a control board 9, and a frame cover 10 as components, and the components are fit together to assemble the vehicular antenna device 1. Hereinafter, the longitudinal direction of the vehicular antenna device 1 is referred to as a front-rear direction (Y-direction), a direction perpendicular to the longitudinal direction in a horizontal plane is referred to as a left-right direction (X-direction), and a direction perpendicular to the longitudinal direction in a vertical plane is referred to as an up-down direction (Z-direction).

Figure 4:
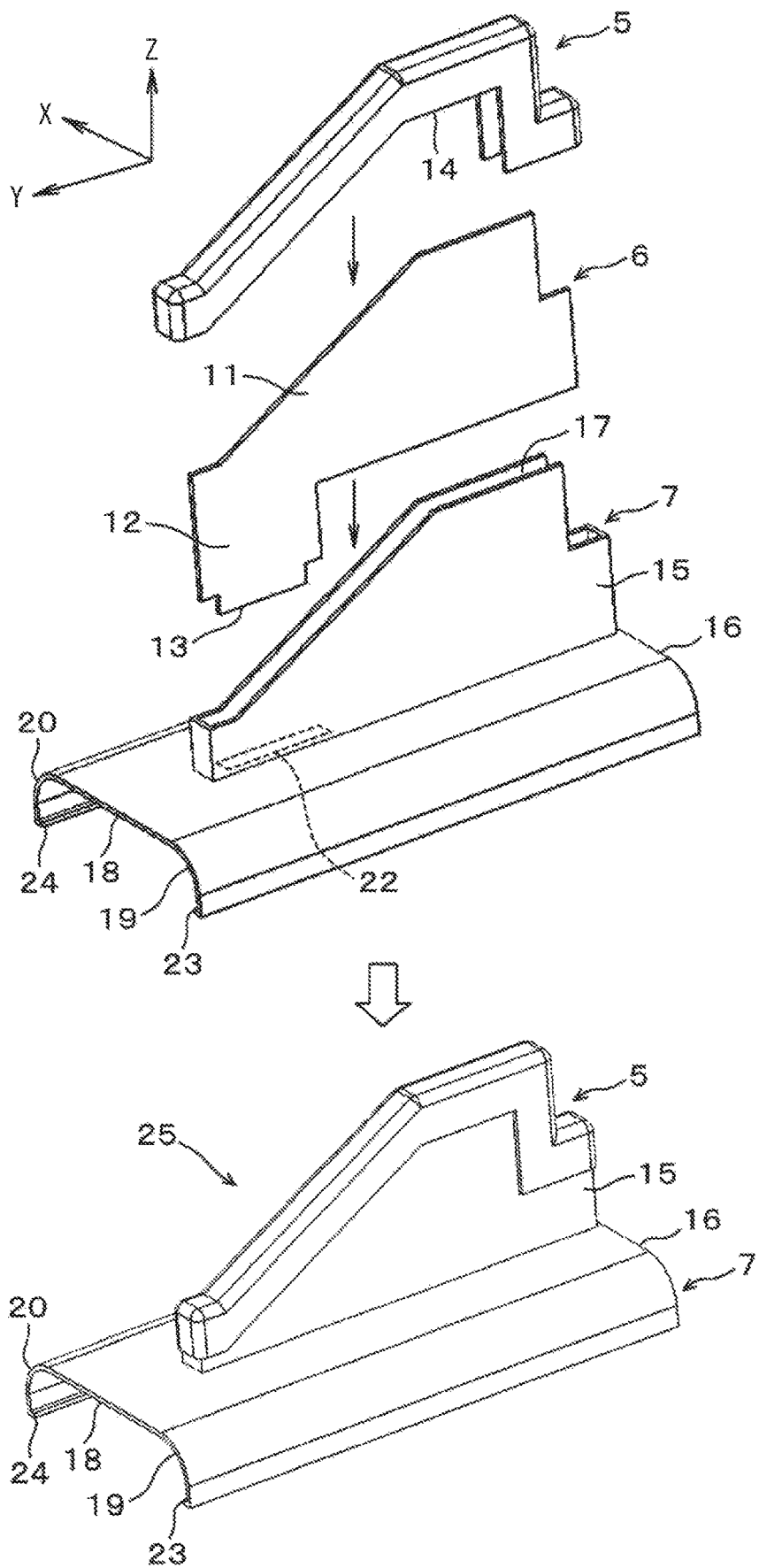
FIG. 4 is a perspective view illustrating a first fixation member, an antenna substrate, a second fixation member, and an antenna unit.

As shown in FIG. 4, the antenna substrate 6 includes a flat plate base made of an electrically insulating material such as resin. The antenna substrate 6 includes an element forming portion 11 that is an upper part having a predetermined shape, and a substrate connection portion 12 that is a lower part having a substantially rectangular shape.

An antenna element is formed on at least one side of the element forming portion 11 by a wiring pattern. The antenna element includes an antenna element configured to transmit and receive radio waves in the frequency band for telephone communication, an antenna element configured to receive radio waves in the frequency band for GPS (Global Positioning System), an antenna element configured to transmit and receive radio waves in the frequency band for vehicle-to-vehicle communication and vehicle-to-infrastructure communication, and the like. That is, the vehicular antenna device 1 functions as an integrated antenna device configured to transmit and receive radio waves in multiple frequency bands for different uses.

A wiring pattern that electrically connects the wiring pattern on the element forming portion 11 and a wiring patter on the control board 9 described later is formed on at least one side of the substrate connection portion 12. The wiring pattern on the element forming portion 11 and the wiring pattern on the substrate connection portion 12 are formed of copper foil, for example. Further, a protrusion portion 13 is formed at a lower end of the substrate connection portion 12, and multiple connection terminals are provided on the edge of the protrusion portion 13.

The first fixation member 5 is made of an electrically insulating material such as resin. The first fixation member 5 has a shape corresponding to an upper end of the element forming portion 11 of the antenna substrate 6, and a groove portion 14 corresponding to the shape is formed on the first fixation member 5. A width of the groove portion 14 in the left-right direction is larger than a thickness of the antenna substrate 6 such that the groove portion 14 is configured to accommodate the upper end of the element forming portion 11 of the antenna substrate 6.

The second fixation member 7 is made of an electrically insulating material such as resin. An upper part of the second fixation member 7 is an antenna substrate accommodation portion 15, and a lower part of the second fixation member 7 is a frame attachment portion 16. The antenna substrate accommodation portion 15 extends upward from the frame attachment portion 16 and has a shape corresponding to parts of the antenna substrate 6 other than the upper end of the element forming portion 11, and the antenna substrate accommodation portion 15 includes a groove portion 17 corresponding to the shape of the parts of the antenna substrate 6 other than the upper end of the element forming portion 11. A width of the groove portion 17 in the left-right direction is larger than a thickness of the antenna substrate 6, and the groove portion 17 is configured to accommodate the parts excepting the upper end of the element forming portion 11. That is, the upper end of the element forming portion 11 of the antenna substrate 6 can be accommodated in the groove portion 14 of the first fixation member 5, and the remaining parts can be accommodated in the groove portion 17 of the antenna substrate accommodation portion 15 of the second fixation member 7.

The frame attachment portion 16 is formed by bending to have a recess shape opening downward. The frame attachment portion 16 has a flat surface portion 18 extending along the front-rear direction, and bent surface portions 19, 20 each of which is bent downward from a left end or a right end of the flat surface portion 18 and extends along the front-rear direction. A lower surface of the flat surface portion 18 faces an antenna fixation surface of an antenna attachment portion 21 (see FIG. 5, described later) of the frame 8 in a situation where the second fixation member 7 is attached to the frame 8. A through-hole portion 22 is formed in the flat surface portion 18. When the parts of the antenna substrate 6 other than the upper end of the element forming portion 11 are accommodated in the groove portion 17 of the antenna substrate accommodation portion 15, the substrate connection portion 12 of the antenna substrate 6 is located in the through-hole portion 22 to extend through the through-hole portion 22. An engaging portion 23, 24 extending along the front-rear direction is formed at an end of an inner surface of each bent surface portion 19, 20.

The first fixation member 5 and the second fixation member 7 are put together with the antenna substrate 6 to assemble an antenna unit 25. That is, the antenna substrate 6 is put together with the second fixation member 7 by fitting the parts of the antenna substrate 6 excepting the upper end of the element forming portion 11 in the groove portion 17 of the antenna substrate accommodation portion 15 of the second fixation member 7. In a situation where the antenna substrate 6 is put together with the second fixation member 7, the upper end of the element forming portion 11 of the antenna substrate 6 is exposed from the groove portion 17, and the substrate connection portion 12 of the antenna substrate 6 extends through the through-hole portion 22 to protrude downward from the through-hole portion 22. The upper end of the element forming portion 11 of the antenna substrate 6 is covered with the groove portion 14 of the first fixation member 5, and thus the first fixation member 5 is put together with the antenna substrate 6 and the second fixation member 7. In a situation where the first fixation member 5 is put together with the antenna substrate 6 and the second fixation member 7, the antenna substrate 6 is held by the first fixation member 5 and the second fixation member 7, and the first fixation member 5 and the antenna substrate accommodation portion 15 of the second fixation member 7 are fit together to enclose the element forming portion 11 of the antenna substrate 6.

Figure 5:
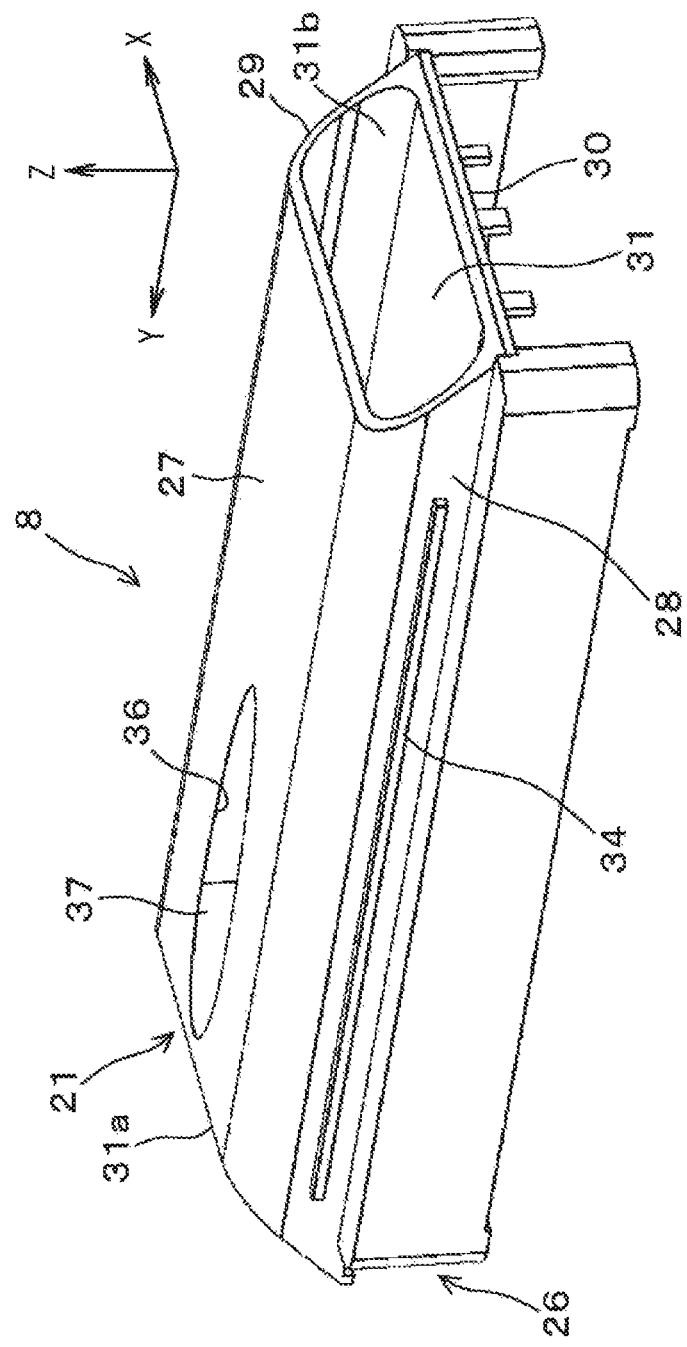
FIG. 5 is a perspective view of a frame viewed from above.

As shown in FIG. 5, the frame 8 is made of a material whose thermal conductivity is relatively high such as die-cast aluminum. An upper part of the frame 8 is the antenna attachment portion 21 described above, and a lower part is a control board accommodation portion 26.

The antenna attachment portion 21 includes an upper side wall 27 extending in the front-rear direction, a left side wall 28, a right side wall 29, and a bottom wall 30. A first space is defined by a first space portion 31 having a cylindrical shape (tunnel shape). The first space portion 31 is constituted by a lower surface of the upper side wall 27, a right surface of the left side wall 28, a left surface of the right side wall 29, and an upper surface (a surface on one side) of the bottom wall 30. That is, the first space portion 31 extends in the front-rear direction. An opening portion 31a at a front end of the first space portion 31 and an opening portion 31b at a rear end of the first space portion 31 face obliquely upward. A gasket 32, 33 is provided on each of the front opening portion 31a and the rear opening portion 31b (see FIGS. 2, 3).

An upper surface of the upper side wall 27 is the antenna fixation surface described above. An engaged portion 34 extending in the front-rear direction is formed on a left surface of the left side wall 28, and an engaged portion 35 extending in the front-rear direction is formed on a right surface of the right side wall 29 (see FIG. 6). In the above described situation where the antenna unit 25 is attached to the frame 8, a lower surface of the flat surface portion 18 of the antenna unit 25 faces the upper surface of the upper side wall 27 of the antenna attachment portion 21, and the antenna unit 25 is fixed to the frame 8 by engaging the engaging portions 23, 24 of the bent surface portions 19, 20 with the engaged portions 34, 35 of the left and right side walls 28, 29.

The antenna attachment portion 21 has a column wall 36 connecting the upper side wall 27 and the bottom wall 30, and an inner surface of the column wall 36 is a second space portion 37 defining a second space having a cylindrical shape (tunnel shape). That is, the second space portion 37 extends in the up-down direction to cross the first space portion 31. In a situation where the antenna unit 25 is fixed to the frame 8, the substrate connection portion 12 of the antenna substrate 6 is accommodated in the second space portion 37. The transverse plane of the column wall 36 has an ellipse-like shape whose diameter in the front-rear direction is longer than a diameter in the left-right direction.

However, the ellipse-like shape is not a perfect ellipse shape, and a part having the largest width in the left-right direction is offset forward from the center. That is, each of the left half and the right half of the column wall 36 in the transverse plane is similar to a vertical cross section of an upper half of a wing of an aircraft, and accordingly the air is likely to flow along the outline of the column wall 36 and turbulence is unlikely to be generated.

Figure 6:
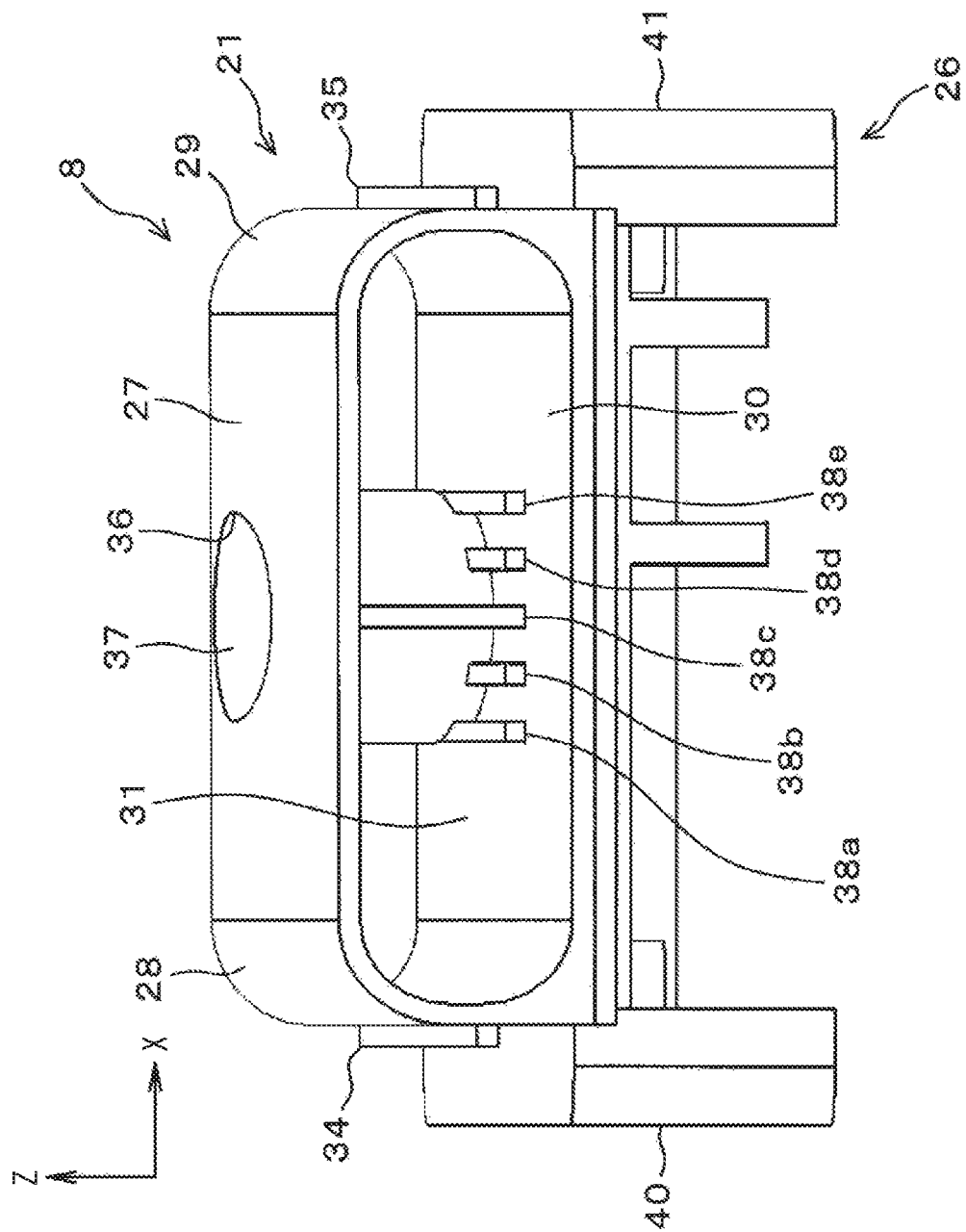
FIG. 6 is a perspective view of a heat dissipation fin.

As shown in FIG. 6, the upper surface of the bottom wall 30 has multiple (five in FIG. 6, for example) heat dissipation fins 38a-38e extending rearward from the column wall 36 in the first space portion 31. The length of the heat dissipation fins 38a-38e as a whole in the left-right direction is substantially the same as the width of the column wall 36 in the left-right direction, and a rear end of each of the heat dissipation fins 38a-38e is located at substantially the same position as the rear end of a heat dissipation member 43 described later. A center one heat radiation fin 38c has a flat plate shape extending from the upper surface of the bottom wall 30 to the lower surface of the upper side wall 27.

Figure 7:
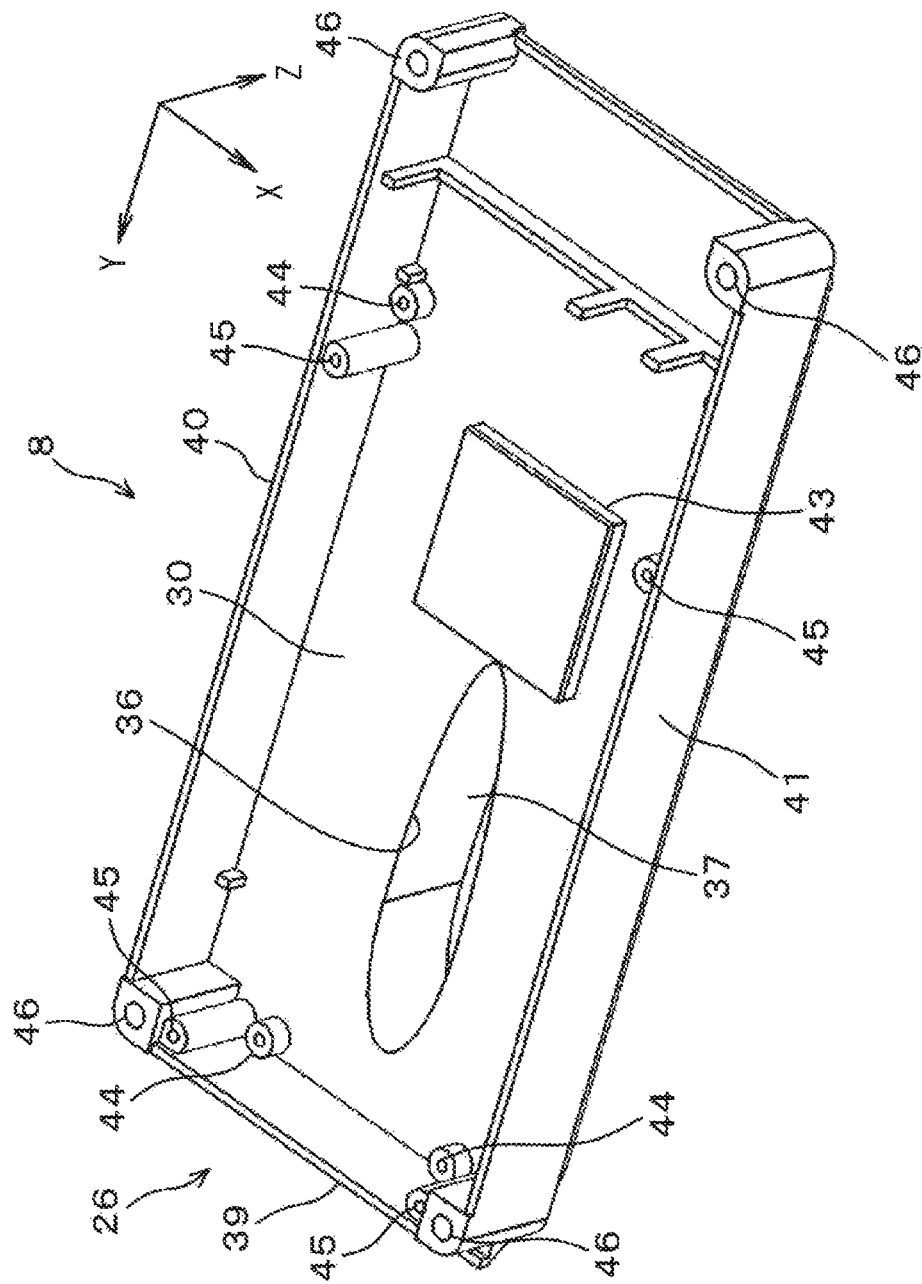
FIG. 7 is a perspective view of the frame viewed from below.

As shown in FIG. 7, the control board accommodation portion 26 has a box shape whose lower side is open. The control board accommodation portion 26 includes a lateral wall 39 extending from a front end part of the bottom wall 30 of the antenna attachment portion 21, and lateral walls 40, 41 extending from a right end part or a left end part of the bottom wall 30 of the antenna attachment portion 21. The lower surface (a surface on the other side) of the bottom wall 30 is an upper surface of the control board accommodation portion 26 and works as a heat receiving surface configured to receive heat from a heat generation member 42 described later (see FIG. 8). A heat dissipation member (TIM: Thermal Interface Materials) 43 including a heat dissipation sheet, a heat dissipation gel, and the like is attached to a predetermined part of the lower surface of the bottom wall 30. The heat dissipation member 43 has substantially the same size in the front-rear direction and the left-right direction as the heat generation member 42. The control board accommodation portion 26 has multiple screw hole portions 44 for fixing the control board 9 to the frame 8 at multiple parts with screws, multiple screw hole portions 45 for fixing the frame cover 10 to the frame 8 at multiple parts with screws, and multiple screw hole portions 46 for fixing the frame 8 to the roof 3 of the vehicle 2 at multiple parts with screws.

Figure 8:
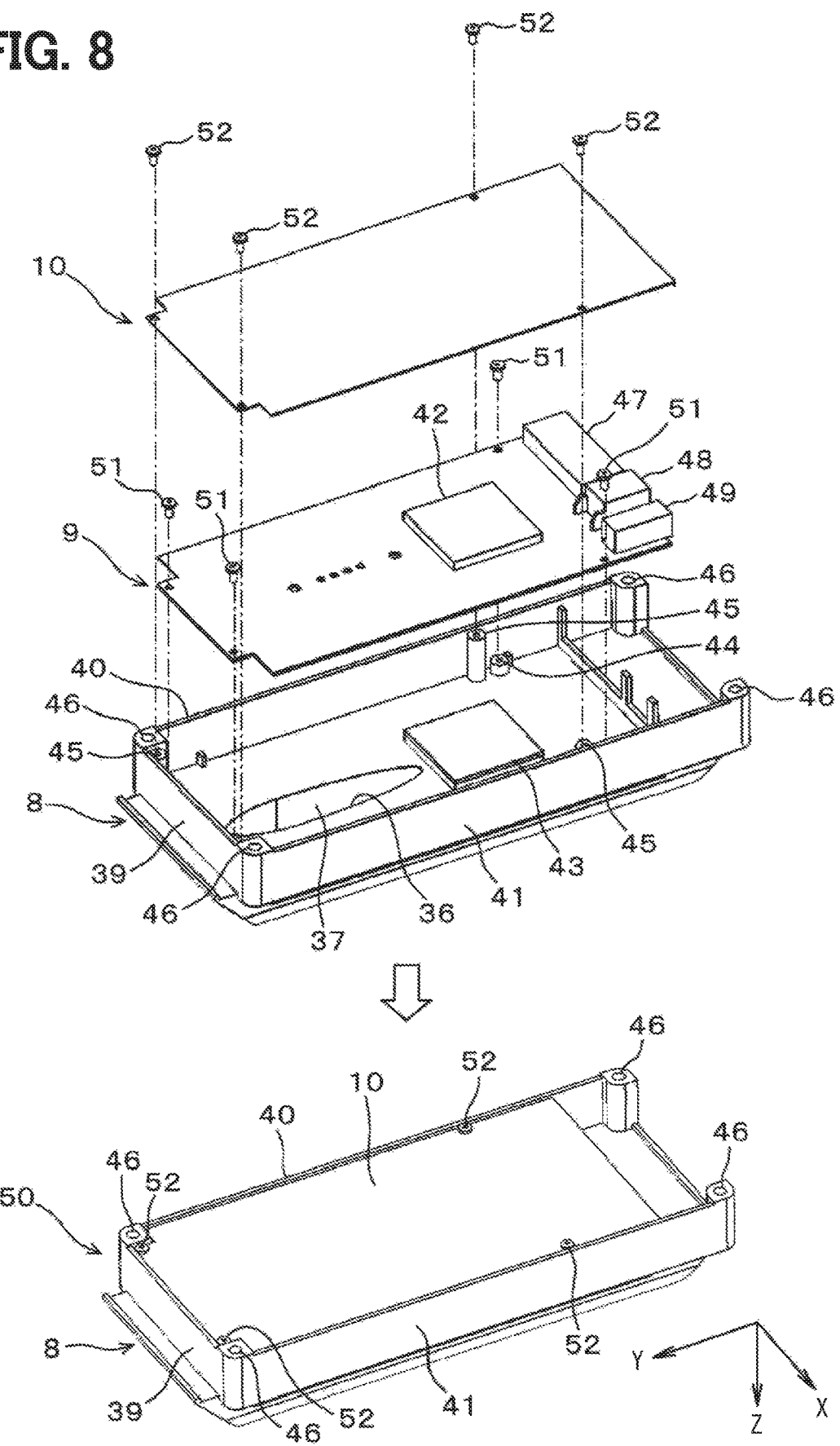
FIG. 8 is a perspective view illustrating the frame, a control board, a frame cover, and a frame unit.

As shown in FIG. 8, the control board 9 includes a flat plate board made of an electrically insulating material such as resin. The control board 9 is a printed wiring board. Wiring patterns are formed and the heat generation member 42 and multiple connectors 47-49 are mounted on the lower surface of the control board 9, i.e. the surface of the control board 9 facing downward when the vehicular antenna device 1 is attached to the roof 3 of the vehicle 2.

The heat generation member 42 is a wireless communication module in which wireless communication circuits are integrated, for example, and has a flat plate shape. The wireless communication circuit is a circuit including a power amplifier configured to amplify transmission signals, a low-noise amplifier configured to amplify reception signals, a bandpass filter on a transmission side, a bandpass filter on a reception side, a switcher configured to switch a supply line to the transmission side or the reception side, and the like. The connectors 47-49 are connectors to which a power supply line configured to supply power to the vehicular antenna device 1 from the outside and signal transmission line configured to transmit signals are connected.

The size of the frame cover 10 in the front-rear direction and the left-right direction is substantially the same as that of the control board 9, and the frame cover 10 is formed of, for example, a flat plate-shaped base material made of an electrically insulating material such as resin.

The frame 8, the control board 9, and the frame cover 10 are put together to assemble a frame unit 50. That is, the control board 9 is accommodated in the control board accommodation portion 26 of the frame 8, the control board 9 is fixed to the frame 8 at multiple parts with multiple screws 51, and thus the control board 9 is joined with the frame 8. That is, the heat generation member 42 is located at a part along the bottom wall 30 and immediately below the heat dissipation member 43. Since the frame cover 10 is fixed to the frame 8 at multiple parts with multiple screws 52, the frame cover 10 and the frame 8 are fit together, and the front side, the upper side, and the lower side of the control board 9 are covered. In the present embodiment, the control board 9 is interposed between the heat dissipation member 43 and the heat generation member 42. However, the heat generation member 42 may be disposed on the upper surface of the control board 9, i.e. the surface facing upward when the vehicular antenna device 1 is attached to the roof 3 of the vehicle 2, such that the heat generation member 42 directly contacts the heat dissipation member 43.

As shown in FIG. 9, the lower surface of the flat surface portion 18 of the frame attachment portion 16 of the second fixation member 7 faces the upper surface of the upper side wall 27 of the antenna attachment portion 21, and the antenna unit 25 is fixed to the frame 8 by engaging the engaging portions 23, 24 of the bent surface portions 19, 20 with the engaged portions 34, 35 of the left and right side walls 28, 29. A body unit 53 is assembled by engaging the antenna unit 25 to the frame unit 50. The antenna element is electrically connected with the wireless communication circuits of the heat generation member 42 by electrically connecting the control board 9 with multiple connection terminals of the protrusion portion 13 of the antenna substrate 6.

As shown in FIG. 10, an attachment opening 54 is formed in the roof 3 of the vehicle 2. When the body unit 53 is attached to the roof 3, a lower part of the control board accommodation portion 26 of the frame 8 is fitted in the attachment opening 54 such that the body unit 53 is supported by an attachment stay 55 of the vehicle located at a position lower than the roof 3. The frame 8 is fixed to the attachment stay 55 of the vehicle at multiple parts with multiple screws 56, and thus the body unit 53 is fixed to the roof 3.

Figure 11:
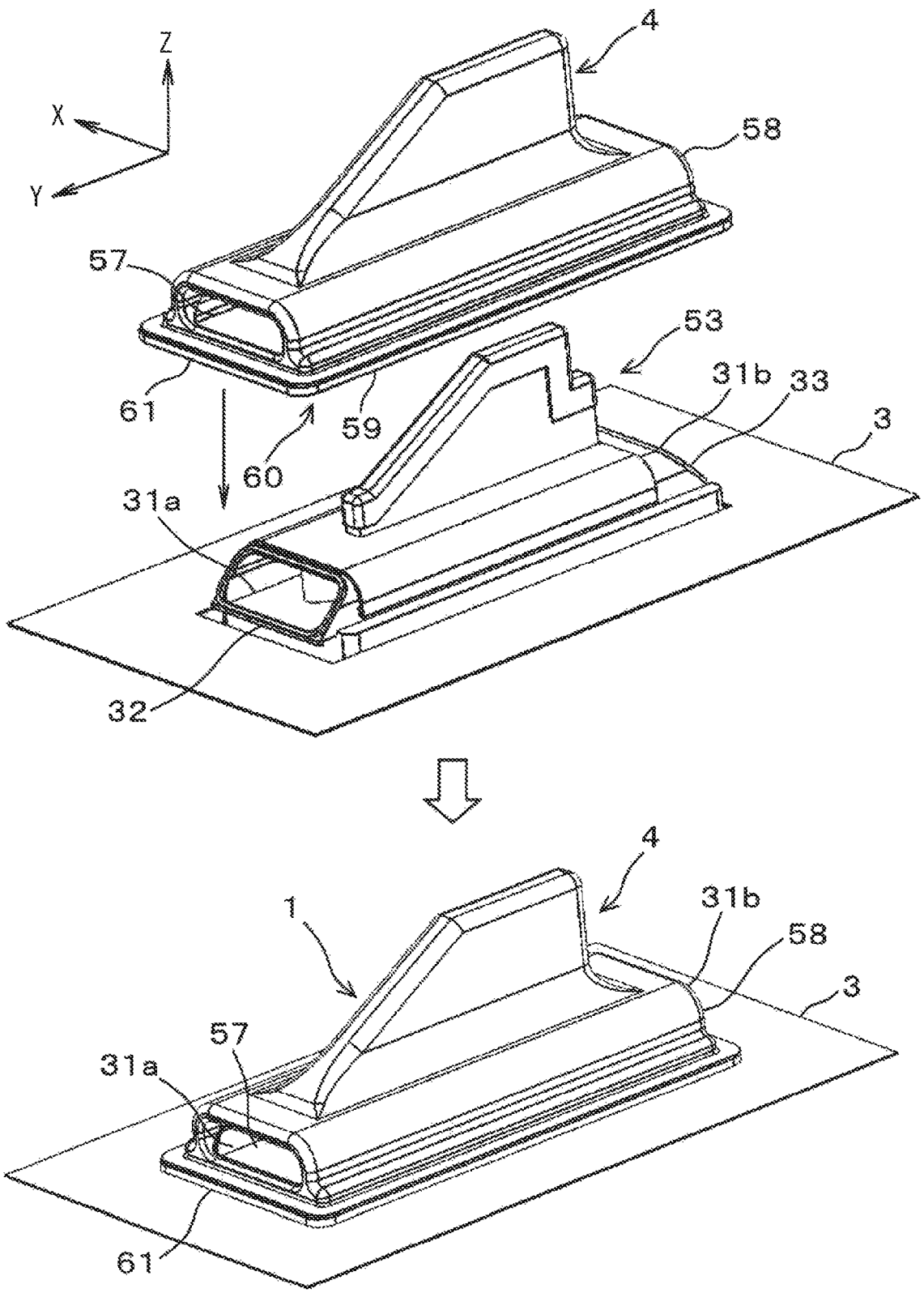
FIG. 11 is a perspective view showing a procedure for attaching a body cover to the body unit.
Figure 12:
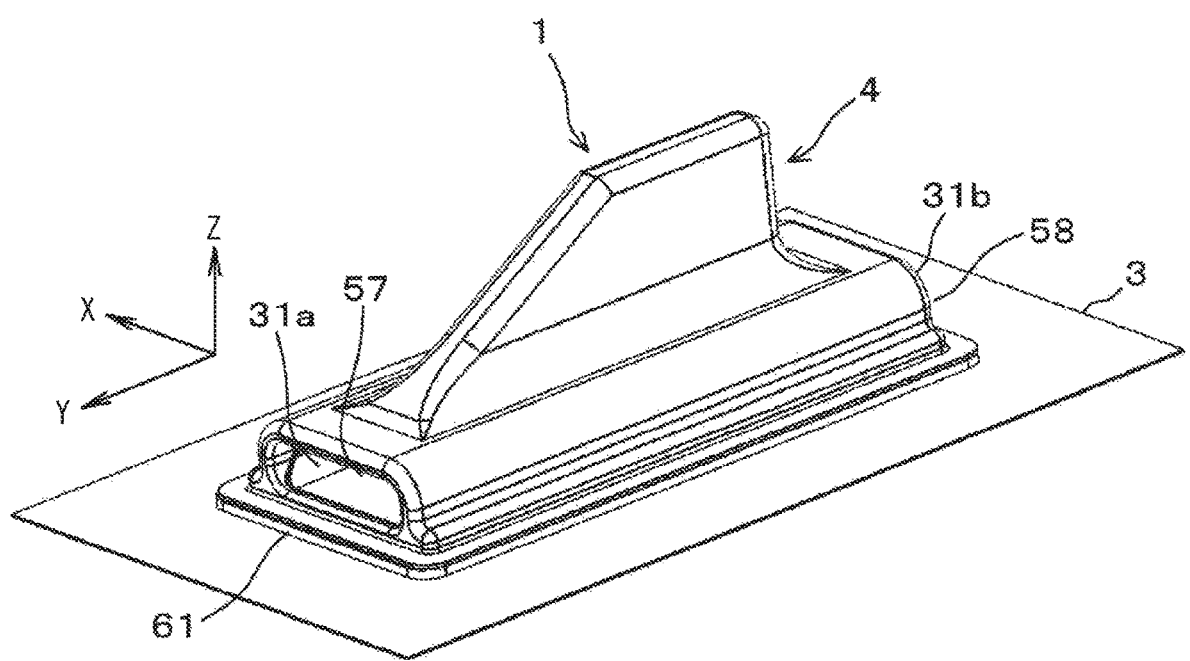
FIG. 12 is a perspective view illustrating the device attached to the roof of the vehicle, the device viewed from above.
Figure 13:
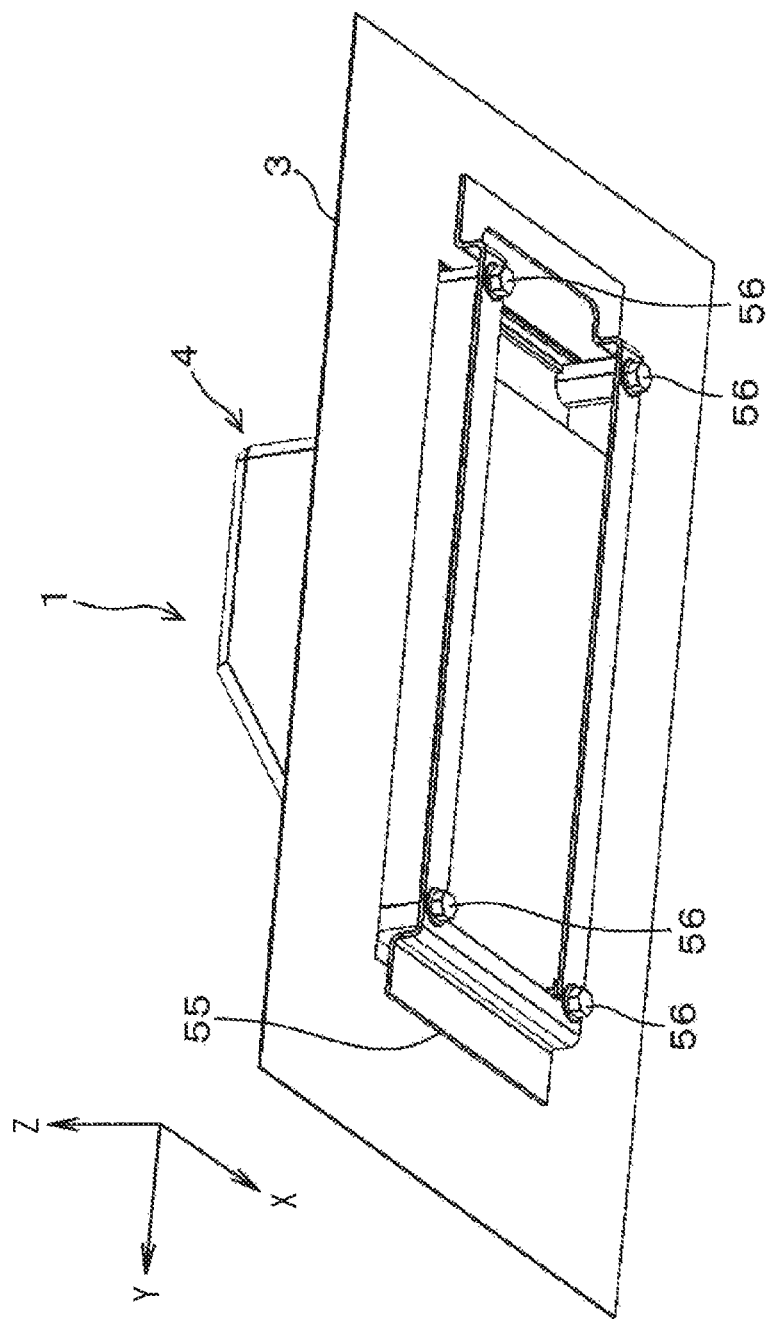
FIG. 13 is a perspective view illustrating the device attached to the roof of the vehicle, the device viewed from below.
Figure 14:
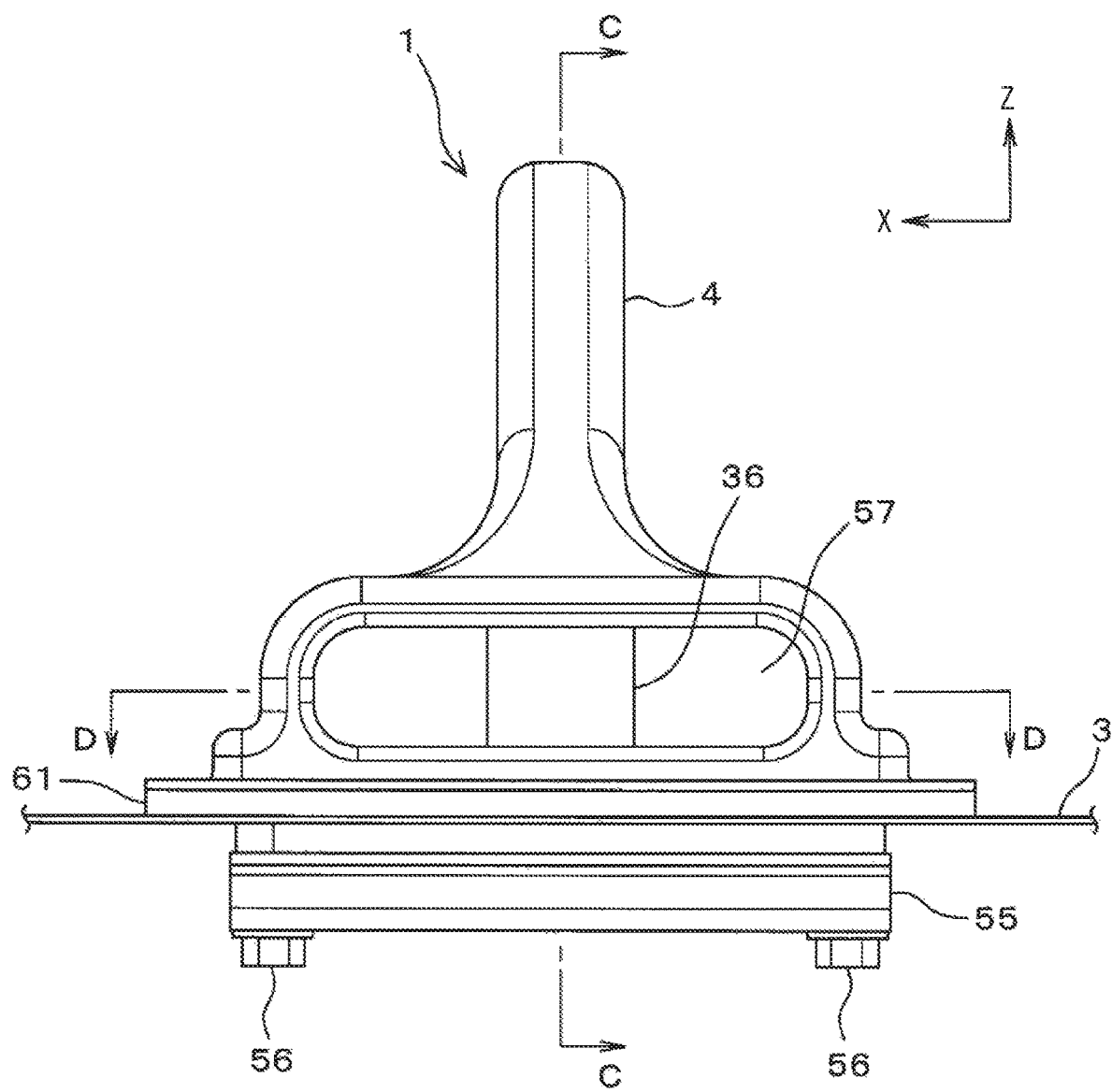
FIG. 14 is a front view illustrating the device attached to the roof of the vehicle.
Figure 15:
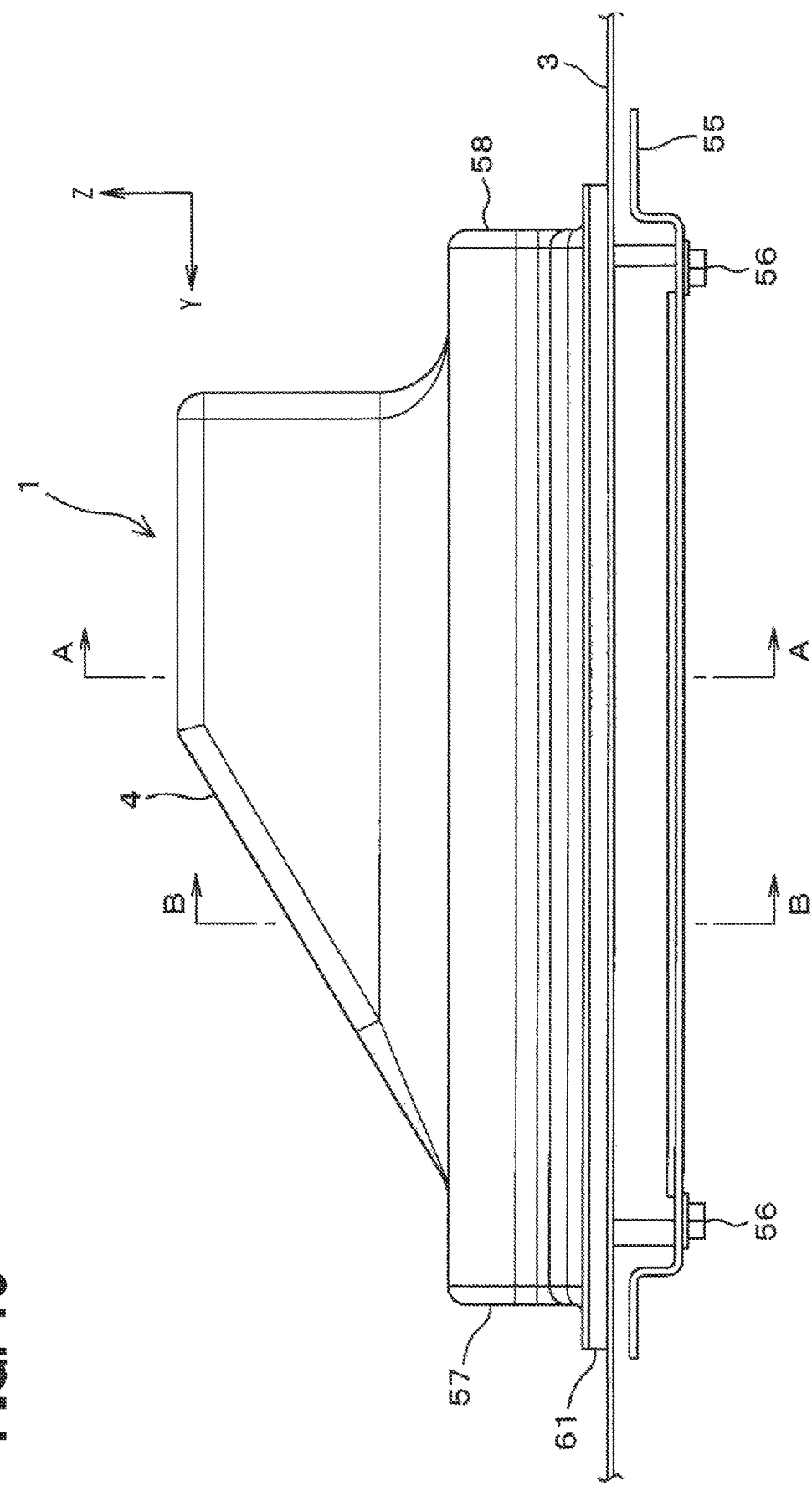
FIG. 15 is a side view illustrating the device attached to the roof of the vehicle.

As shown in FIG. 11, the body cover 4 has the opening portion 57 on the front side, the opening portion 58 on the rear side, and the opening portion 59 on the lower side. The opening portions 57-59 define a body unit accommodation portion 60. The opening portion 57 on the front side defines a plane that is in parallel with the front opening portion 31a of the first space portion 31. The opening portion 58 on the rear side defines a plane that is in parallel with the rear opening portion 31b of the first space portion 31. A gasket 61 (see FIGS. 2, 3) is provided on a lower side of the body cover 4.

As shown in FIGS. 12, 13, 14, 15, 16, 17, 18 and 19, when the body unit 53 is attached to the roof 3, the body unit 53 is covered with the body unit accommodation portion 60 of the body cover 4, and the body cover 4 is fixed to the roof 3 at multiple parts with multiple screws 62. Thus, the body cover 4 is attached to the roof 3. Since the gasket 32 located on the front side of the first space portion 31 is pushed against the front opening portion 57 of the body cover 4, the waterproof property at the opening portion 31a of the first space is secured. Moreover, since the gasket 33 located on the rear side of the first space portion 31 is pushed against the rear opening portion 58 of the body cover 4, the waterproof property at the opening portion 31b of the first space is secured. Since the gasket 61 arranged on the lower side of the body cover 4 is pushed against the roof 3, the waterproof property is secured at a part where the body cover 4 and the roof 3 contact with each other.

Figure 16:
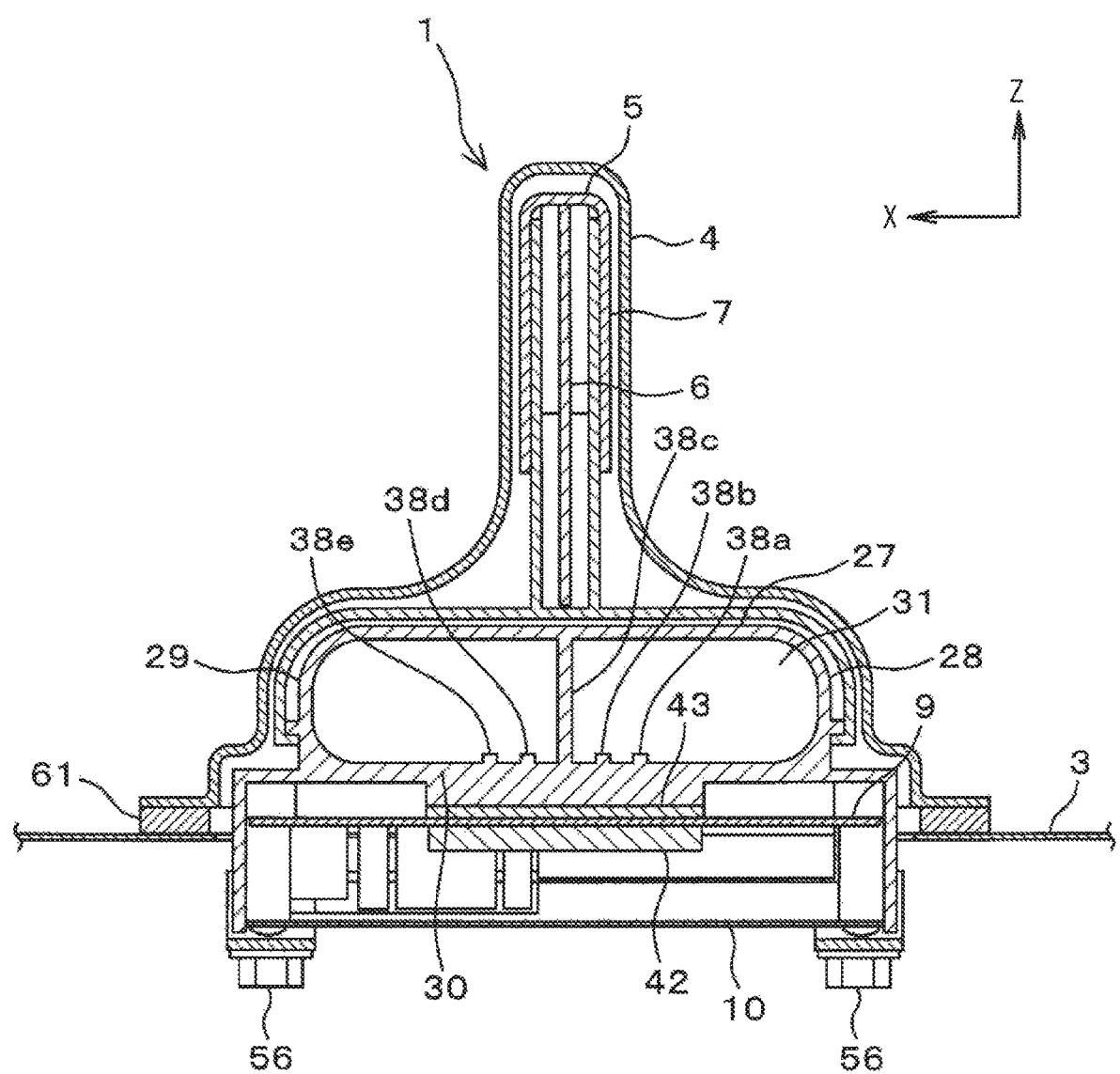
FIG. 16 is a cross-section of the device attached to the roof of the vehicle.
Figure 17:
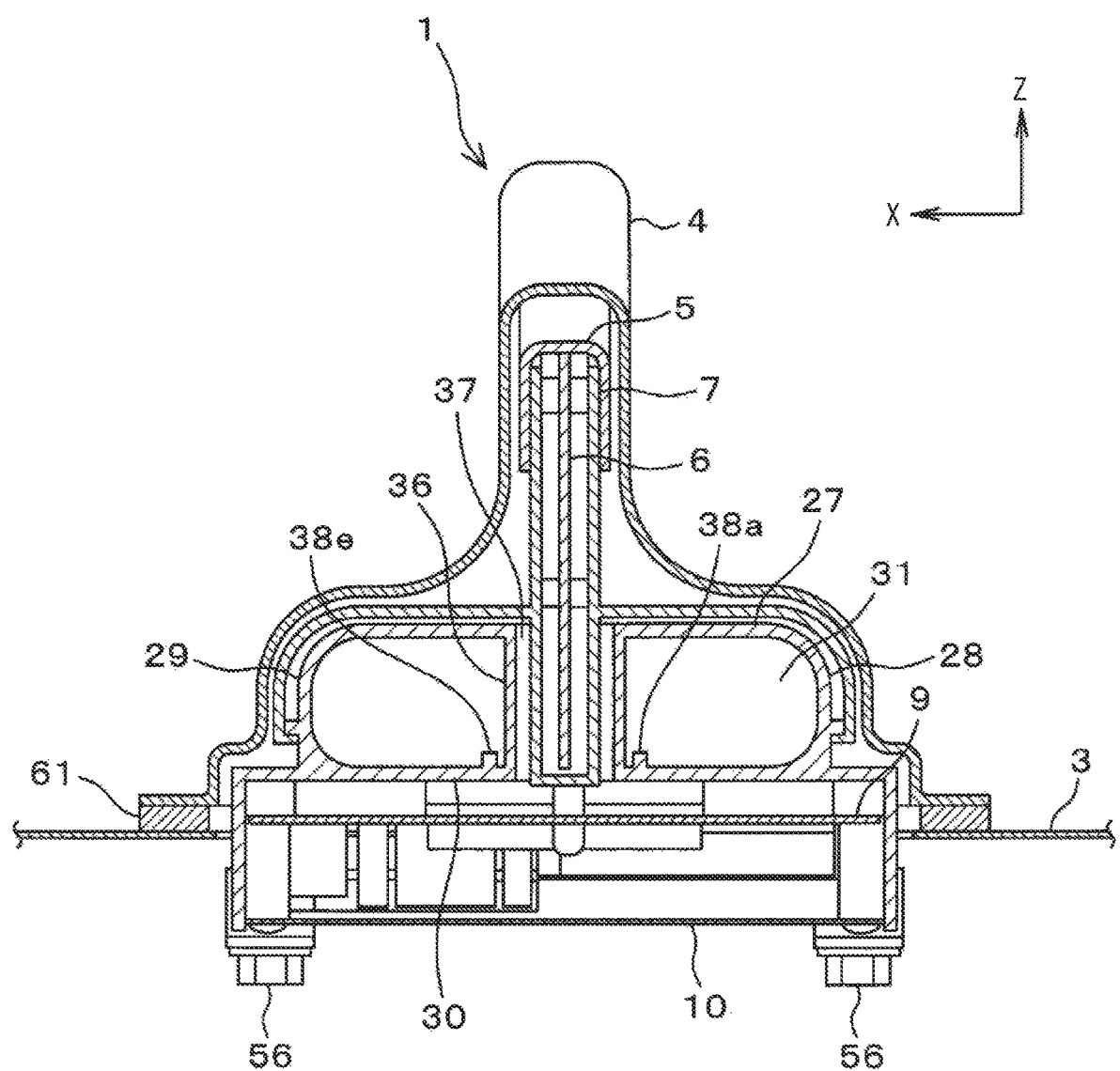
FIG. 17 is a cross-section of the device attached to the roof of the vehicle.
Figure 18:
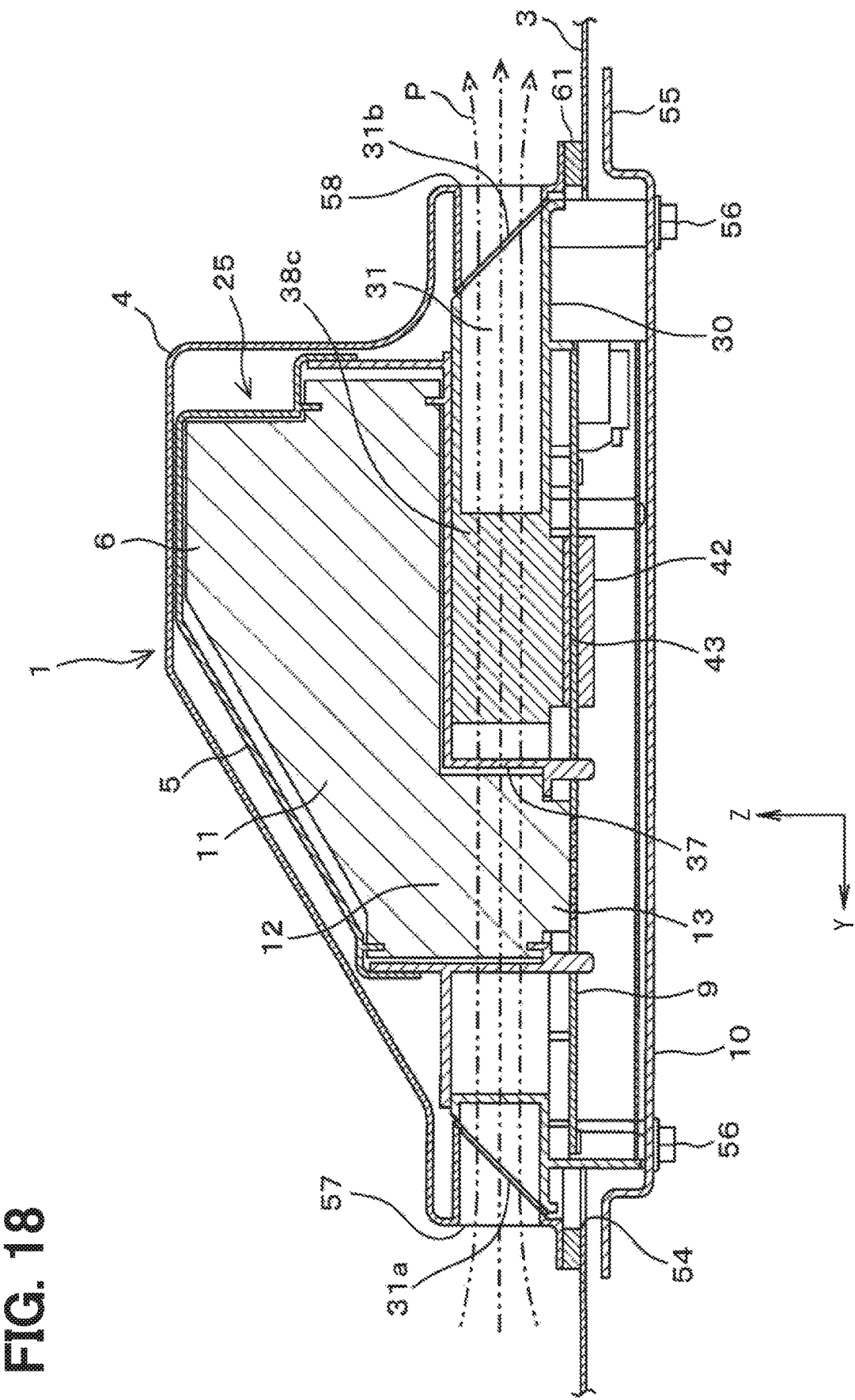
FIG. 18 is a cross-section for explaining an airflow.
Figure 19:
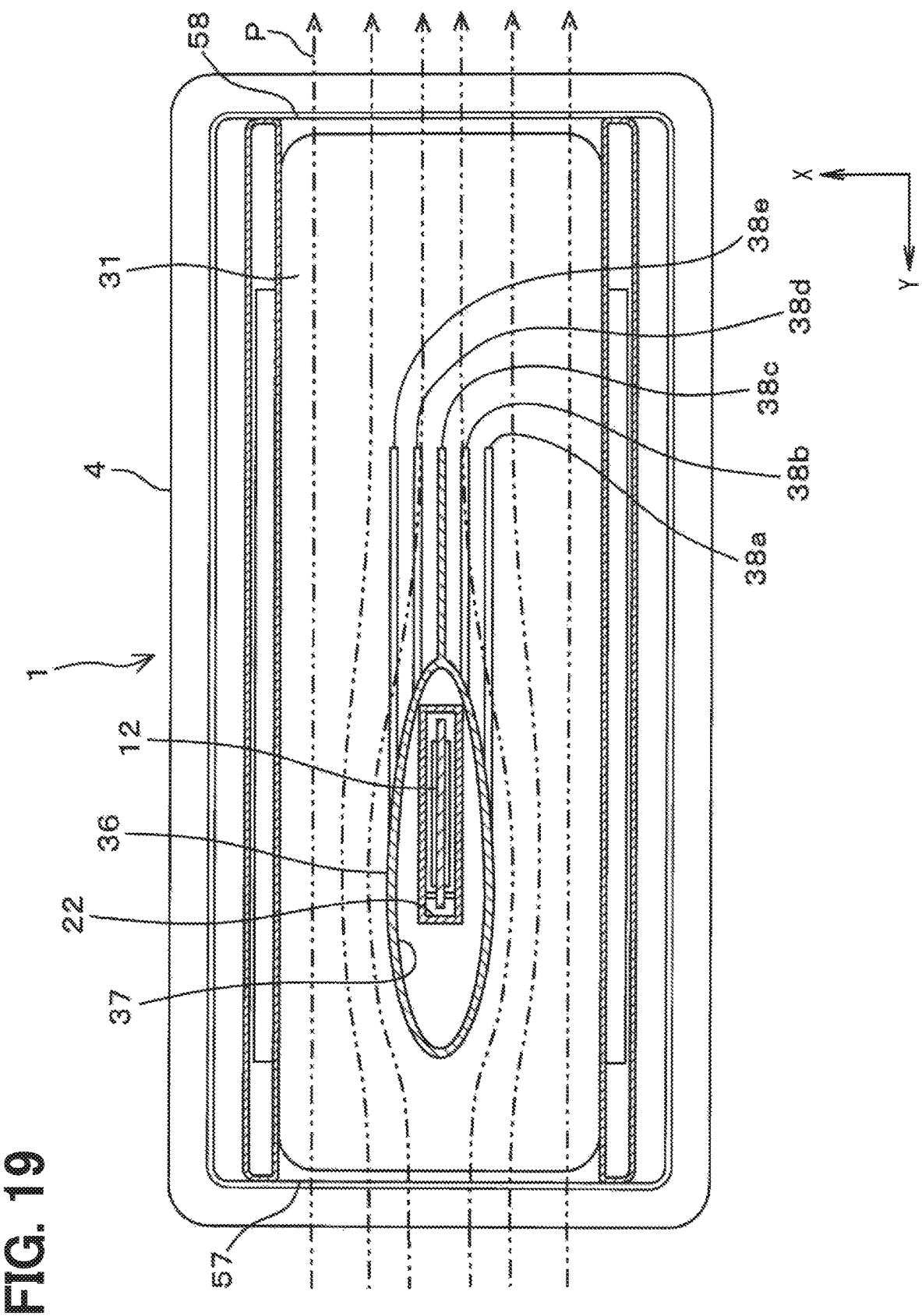
FIG. 19 is a cross-section for explaining an airflow.

The vehicular antenna device 1 is attached to the roof 3 by attaching the body cover 4 to the roof 3. When the vehicular antenna device 1 is attached to the roof 3, the frame 8 is covered with the body cover 4 excepting the first space portion 31, and only the first space portion 31 is exposed to the outside air. FIG. 16 is a cross-section taken along A-A line of FIG. 15. FIG. 17 is a cross-section taken along B-B line of FIG. 15. FIG. 18 is a cross-section taken along C-C line of FIG. 14. FIG. 19 is a cross-section taken along D-D line of FIG. 14.

In the arrangement described above, the heat generation member 42 is located immediately below the heat dissipation member 43 as shown in FIGS. 18, 19, and accordingly the heat generated by the heat generation member 42 is transferred to the heat dissipation member 43 through the control board 9. The heat transferred to the heat dissipation member 43 is transferred from the lower surface to the upper surface of the bottom wall 30 defining the first space, and thus the heat is released in the first space. The thermal resistance is generated at a part between the lower surface and the upper surface of the bottom wall 30. However, since the cross-sectional area for the heat conduction is large and the heat conduction path is short as compared with a general structure in which heat is transferred through a bracket, the area where the thermal resistance may be generated is made small as much as possible.

When the vehicle 2 is moving forward, for example, an airflow is generated in the first space defined by the first space portion 31 such that the air flows from the front opening portion 31a to the rear opening portion 31b as indicated by arrows P in FIGS. 18, 19. The heat released in the first space defined by the first space portion 31 does not stay in the first space but is conveyed by the airflow toward outside the first space. As a result, the heat of the heat generation member 42 can be appropriately dissipated. Moreover, when the outside air flows into the first space from the opening portion 31a or the opening portion 31b to generate an airflow in the first space, the same effect can be obtained even when the vehicle 2 stops. Further, when the vehicular antenna device 1 is attached such that the rear side is slightly lower than the front side, heated air in the first space moves upward to generate an airflow even when the outside air does not flow in from the opening portion 31a, or the opening portion 31b. Consequently, the same effect can be obtained.

In this case, although the column wall 36 is provided in the first space defined by the first space portion 31, since the column wall 36 is shaped so as not to cause turbulence in the airflow as described above, the heat released in the first space can be quickly conveyed to the outside of the first space.

The first embodiment as described above provides the effects below. The vehicular antenna device 1 includes the first space portion 31 that has a cylindrical shape and is exposed to the outside air in the situation where the vehicular antenna device 1 is attached to the roof 3 of the vehicle 2, and the heat generation member 42 is arranged at a position along the lower surface that is a reverse side of the upper surface of the bottom wall 30 defining the first space.

The heat generated by the heat generation member 42 is transferred to the heat dissipation member 43 through the control board 9, and the heat transferred to the heat dissipation member 43 is transferred from the lower surface to the upper surface of the bottom wall 30 to be released in the first space. The thermal resistance is generated at a part between the lower surface and the upper surface of the bottom wall 30. However, since the cross-sectional area for the heat conduction is large and the heat conduction path is short as compared with a general structure in which heat is transferred through a bracket, the area where the thermal resistance may be generated is made small as much as possible. When an airflow is generated in the first space defined by the first space portion 31, the heat released in the first space does not stay in the first space and can be quickly conveyed by the airflow to the outside of the first space. Since the area where the thermal resistance may be generated between the heat generation member 42 and the first space portion 31 is made small as much as possible, and the heat released in the first space can be quickly conveyed to the outside of the first space, the heat of the heat generation member 42 can efficiently dissipated.

The heat dissipation member 43 is disposed between the heat generation member 42 and the bottom wall 30. Accordingly, the heat generated by the heat generation member 42 can be appropriately transferred to the lower surface of the bottom wall 30 by the heat dissipation member 43, and the heat of the heat generation member 42 can be appropriately released.

Further, parts of the frame 8 other than the first space portion 31 is covered with the body cover 4. Accordingly, the sunlight is not directly irradiated to the frame 8, and the effect of the solar radiation can be suppressed. As a result, the heat dissipation from the heat generation member 42 would not be obstructed by the influence of the solar radiation.

Further, the second space portion 37 defining the second space in which the substrate connection portion 12 configured to electrically connect the antenna substrate 6 and the control board 9 is accommodated. Since the antenna substrate 6 and the control board 9 can be electrically connected through a part of the first space portion 31, it is unnecessary to provide wiring for electrical connection between the antenna substrate 6 and the control board 9 outside the first space portion 31. Accordingly the device can be made compact.

Second Embodiment

Next, a second embodiment will be described with reference to FIG. 20. In the first embodiment, only the center one heat dissipation fin 38c of the heat dissipation fins has a flat plate shape extending from the upper surface of the bottom wall 30 to the lower surface of the upper side wall 27. However, in the second embodiment, each of the heat dissipation fins has a flat plate shape extending from the upper surface of the bottom wall 30 to the lower surface of the upper side wall 27.

Figure 20:
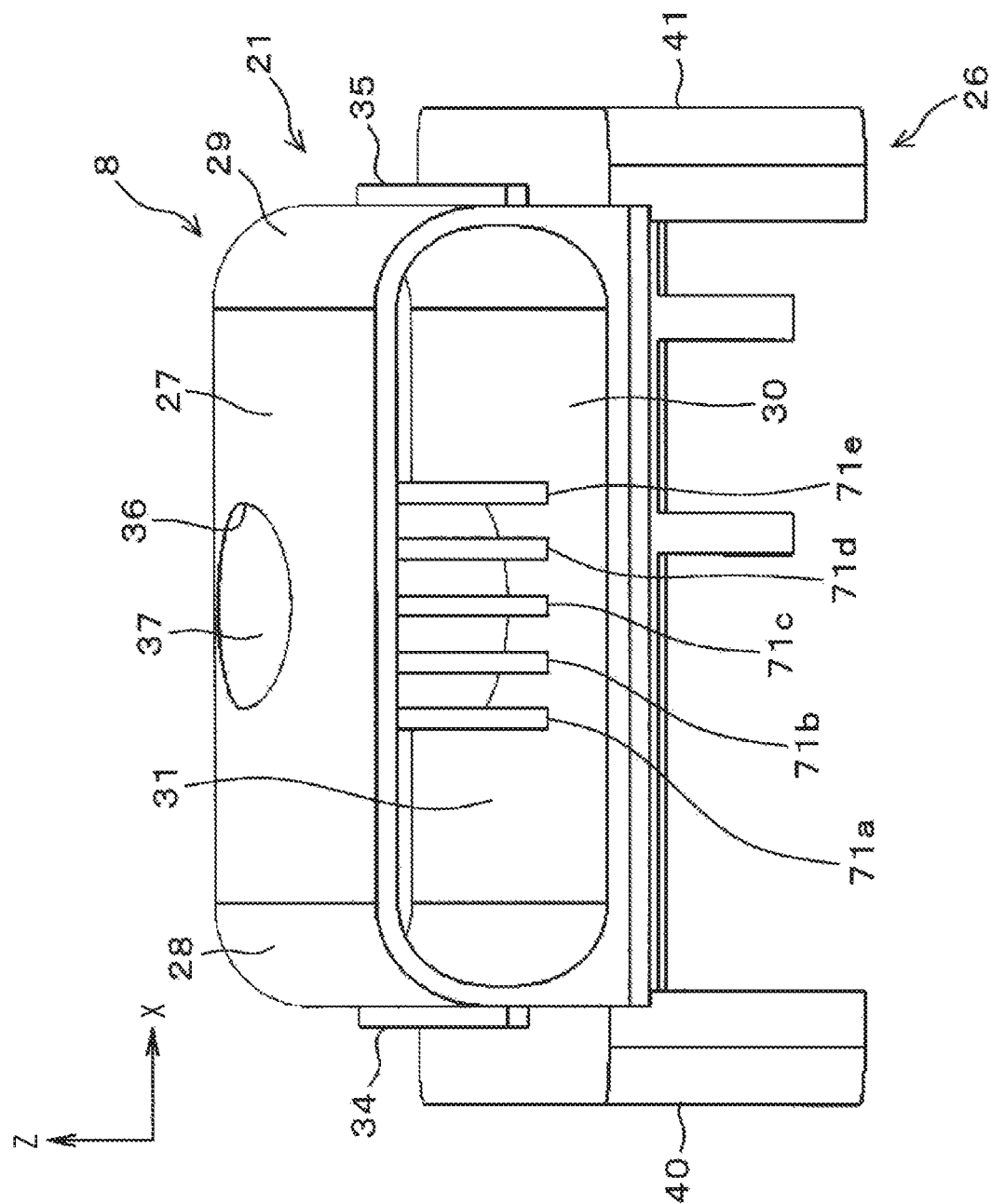
FIG. 20 is a perspective view showing a heat dissipation fin according to a second embodiment.

As shown in FIG. 20, the upper surface of the bottom wall 30 has multiple (five in FIG. 20, for example) heat dissipation fins 71a-71e extending rearward from the column wall 36 in the first space portion 31. Each heat dissipation fin 71a-71e has a flat plate shape extending from the upper surface of the bottom wall 30 to the lower surface of the upper side wall 27. According to the second embodiment, the heat generated by the heat generation member 42 can be released in the first space from the heat dissipation fins 71a-71e. In addition, the frame 8 can be used as a heat sink that transfers the heat to the upper side wall 27 through the heat dissipation fins 71a-71e, and accordingly the heat of the heat generation member 42 can be dissipated appropriately.

Third Embodiment

Next, a third embodiment will be described with reference to FIG. 21. In the first embodiment, the length of the heat dissipation fins 38a-38e as a whole in the left-right direction is substantially the same as the width of the column wall 36 in the left-right direction. However, in the third embodiment, the heat dissipation fins are protrusions, and the length of the heat dissipation fins as a whole in the left-right direction is greater than the width of the column wall 36 in the left-right direction.

Figure 21:
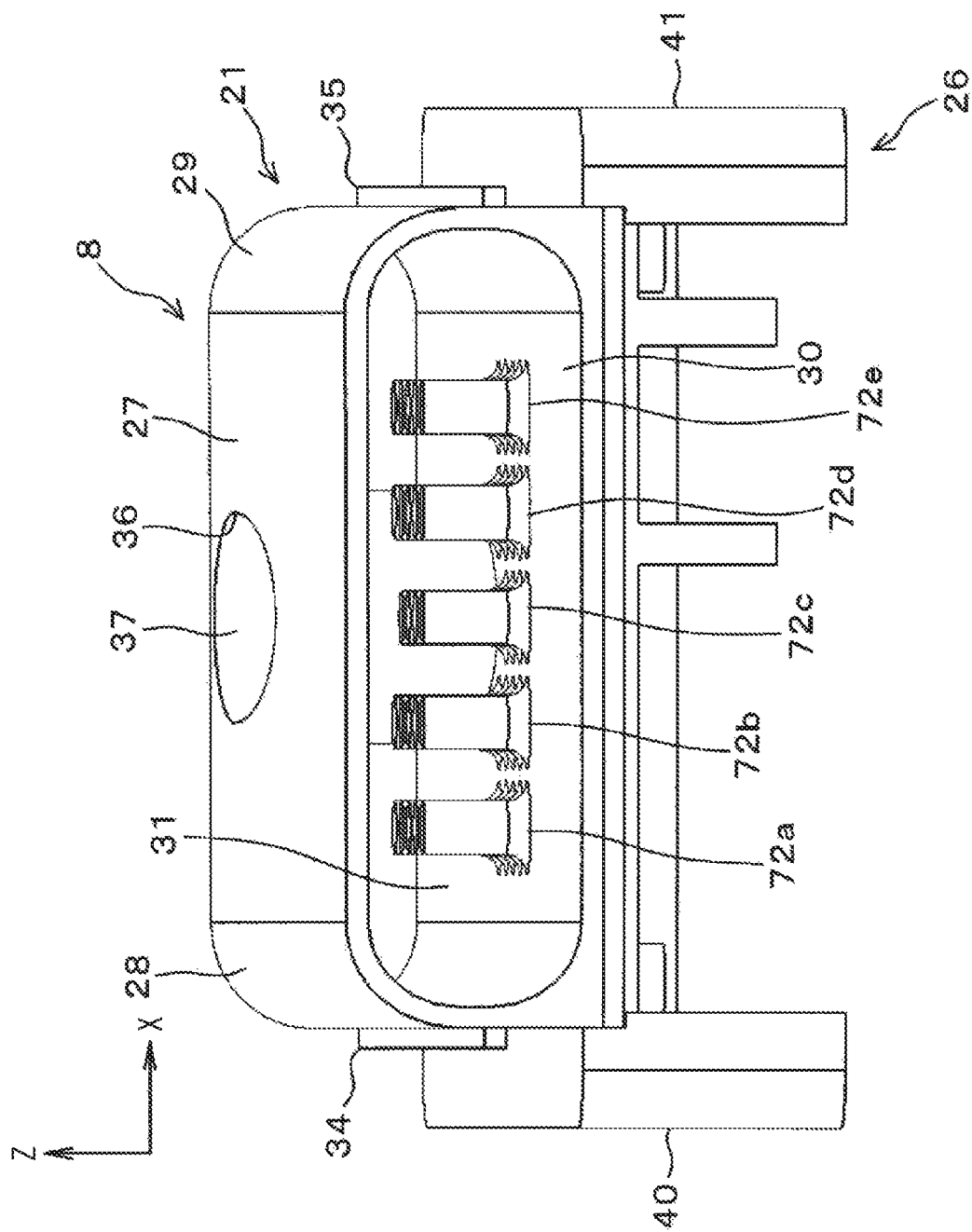
FIG. 21 is a perspective view illustrating a heat dissipation fin according to a third embodiment.

As shown in FIG. 21, multiple heat dissipation fins 72a, 72b, 72c, and so on protrude from the upper surface of the bottom wall 30 and are aligned in the front-rear direction and the left-right direction to form a grid pattern. In this case, the heat dissipation fins 72a, 72b, 72c, and so on are arranged to correspond to positions to which the heat dissipation member 43 is attached, and the length of the heat dissipation fins as a whole in the left-right direction is greater than the width of the column wall 36 in the left-right direction. According to the third embodiment, the heat of the heat generation member 42 can be released from the heat dissipation fins 72a, 72b, 72c, and so on in the first space, and the heat of the heat generation member 42 can be released appropriately.

Fourth Embodiment

Next, a fourth embodiment will be described with reference to FIGS. 22 and 23. In the first embodiment, the first space portion 31 and the control board 9 are in the frame 8 that is a single component. However, in the fourth embodiment, the first space portion and the control board are in separated frames.

Figure 22:
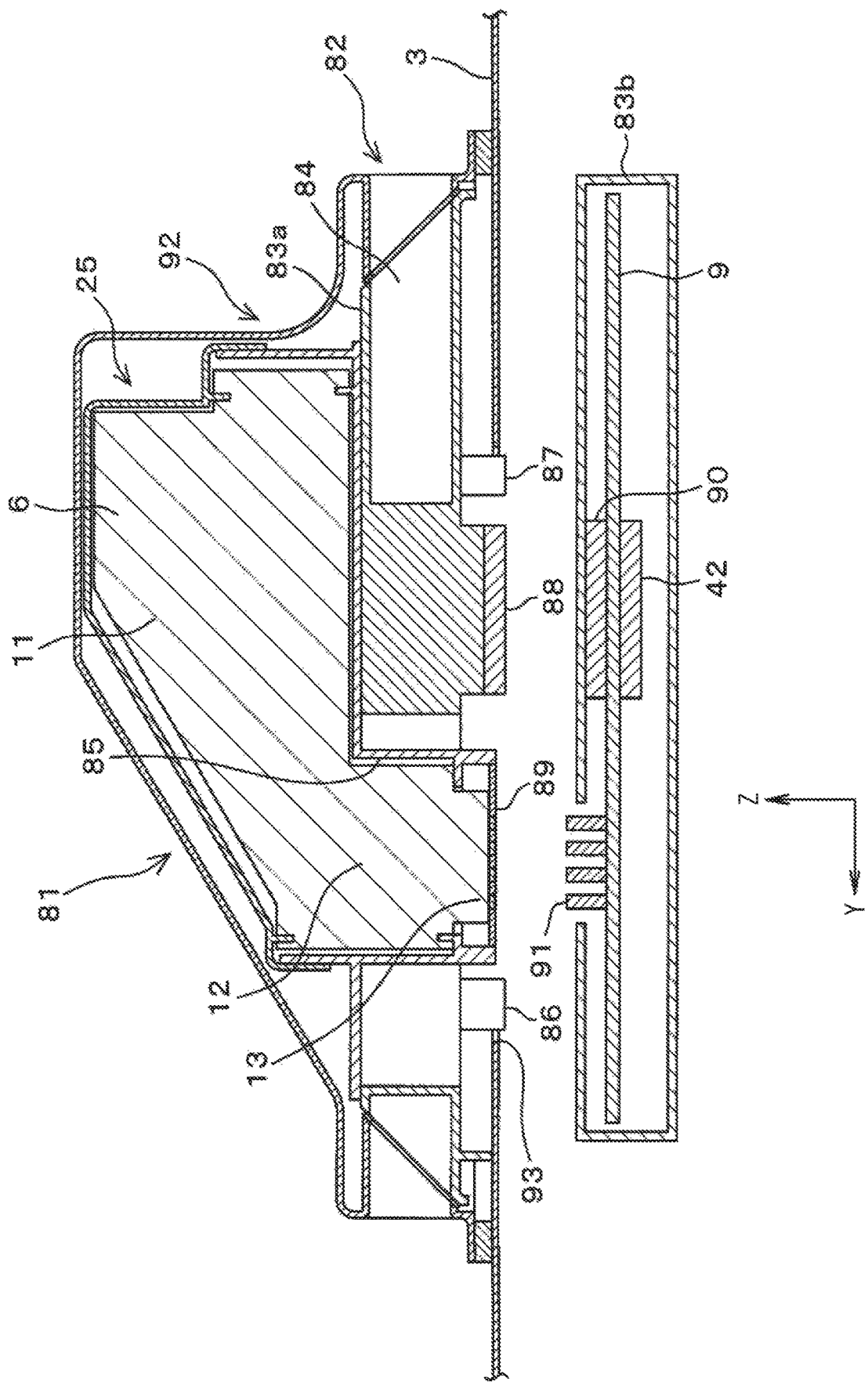
FIG. 22 is a cross section showing a state before the attachment of the device according to a fourth embodiment.
Figure 23:
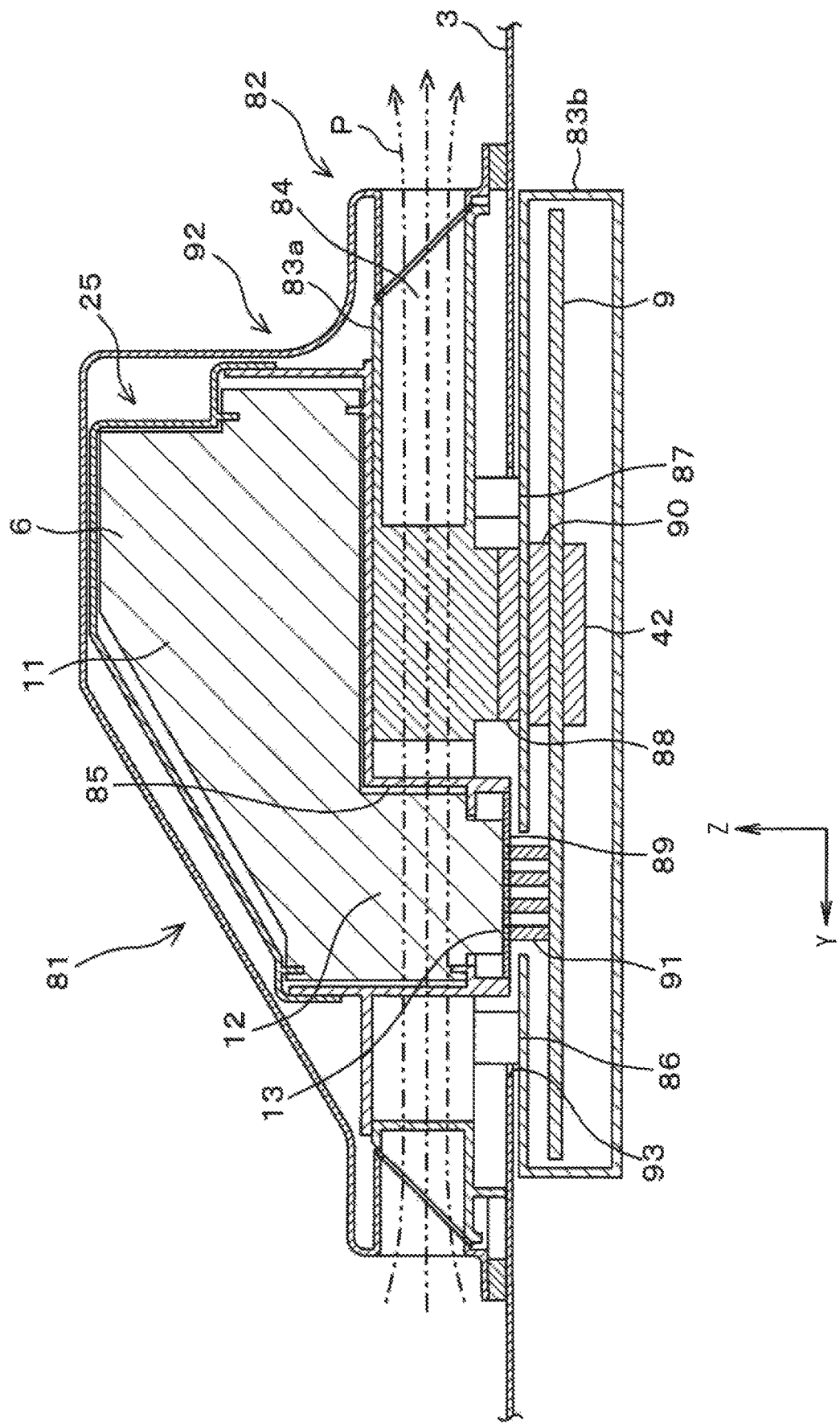
FIG. 23 is a cross-section for explaining an airflow.

As shown in FIGS. 22, 23, a vehicular antenna device 81 includes a frame 82 instead of the frame 8 described in the first embodiment. The frame 82 includes an upper frame 83a and a lower frame 83b coupled with each other.

The upper frame 83a is a frame attached to an upper side of the roof 3 of the vehicle 2 and has the same function as the antenna attachment portion 21 described in the first embodiment. The upper frame 83a includes a first space portion 84 and a second space portion 85 which are similar to the first space portion 31 and the second space portion 37 respectively. Connection portions 86, 87 are formed on a lower side of the upper frame 83a, and a first heat dissipation member 88 is attached to the lower side of the upper frame 83a. An auxiliary substrate 89 is provided on the protrusion portion 13 of the antenna substrate 6. The lower frame 83b is a frame attached to a lower side of the roof 3 and has the same function as the control board accommodation portion 26 described in the first embodiment. The control board on which the heat generation member 42 is mounted is accommodated in the lower frame 83b. A second heat dissipation member 90 is attached on and connection terminals 91 are provided on a reverse side of the surface of the control board 9 on which the heat generation member 42 is mounted.

A body unit 92 is assembled by engaging the antenna unit 25 to the upper frame 83. An attachment opening 93 is formed in the roof 3 of the vehicle 2. The body unit 92 is attached to the upper side of the roof 3 from above the roof 3 such that the connection portions 86, 87, the first heat dissipation member 88, and the auxiliary substrate 89 are arranged in the attachment opening 93. The lower frame 83b is attached to the lower side of the roof 3 from below the roof 3. The antenna element is electrically connected with the wireless communication circuits of the heat generation member 42 by electrically connecting the control board 9 with the auxiliary substrate 89 of the protrusion portion 13 of the antenna substrate 6 through the connection terminals 91.

In the arrangement described above, the heat generation member 42 is located immediately below the first heat dissipation member 88 and the second heat dissipation member 90, and the heat generated by the heat generation member 42 is transferred to the second heat dissipation member 90 through the control board 9. The heat transferred to the second heat dissipation member 90 is transferred to the first heat dissipation member 88 through the lower frame 83b. The heat transferred to the first heat dissipation member 88 is transferred from the lower surface to the upper surface of the bottom wall defining the first space, and thus the heat is released in the first space defined by the first space portion 84. That is, in this case also, the area where thermal resistance may occur can be made small as in the first embodiment compared to a general case where the heat is transferred through the bracket.

In the first embodiment in which the control board 9 is accommodated in the frame 8, a size of the attachment opening 54 in the front-rear direction and the left-right direction is necessary to be greater than at least the size of the control board 9 in the front-rear direction and the left-right direction for embedding a part of the frame 8 in the roof 3 of the vehicle 2. In contrast, since the control board 9 is accommodated in the lower frame 83b in the fourth embodiment, the side of the attachment opening 93 of the roof 3 of the vehicle 2 in the front-rear direction and the left-right direction is not necessary to be greater than the size of the control board 9 in the front-rear direction and the left-right direction.

According the fourth embodiment, the similar effects with the first embodiment can be obtained. Further, the opening area of the attachment opening 93 of the roof 3 of the vehicle 2 can be made smaller compared to the opening area of the attachment opening 54 described in the first embodiment. Moreover, even when a large control board 9 is used for higher functionality, the lower frame 83b can be made larger in accordance with the size of the control board 9, and accordingly it is not needed to make the upper frame 83a larger. That is, it is possible to avoid increasing the size of the portion exposed upward from the roof 3, and to avoid impairing the appearance. In addition, air resistance received by the vehicular antenna device 81 can be suppressed.

Other Embodiments

Although the present disclosure has been described in accordance with the examples, it is understood that the present disclosure is not limited to such examples or structures. The present disclosure encompasses various modifications and variations within the scope of equivalents. Additionally, various combinations and configurations, as well as other combinations and configurations including more, less, or only a single element, are within the scope and spirit of the present disclosure.

In the above-described configuration, the heat generation member 42 is located below the first space portion 31, and the heat of the heat generation member 42 is transferred through the bottom wall 30. However, the heat generation member 42 may be located above the first space portion 31, and the heat of the heat generation member 42 can be transferred through the upper side wall 27.

The shape of the first space portion 31 is not limited to a square shape and can be any shape. The shape of the cross-section of the second space portion 37 is not limited to the above-described shape. Any shape is acceptable as long as the shape is not likely generate turbulence.

The heat received by the body cover 4 due to the effect of solar radiation can be suppressed from transferred to the frame 8 by providing a heat insulation material in a gap between the body cover 4 and the frame 8 or a gap between the first fixation member 5 and the second fixation member 7. The heat received by the roof 3 or the attachment stay 55 due to the effect of solar radiation can be suppressed from transferred to the frame 8 by providing a heat insulation material in a gap between the roof 3 and the frame 8 or a gap between the attachment stay 55 and the frame 8.

In the above-described configuration, the vehicular antenna device 1 is attached such that the front-rear direction of the first space portion 31 coincides with the longitudinal direction of the vehicle. However, if it is concerned that the first space portion 31 might act as a whistle when the first space portion 31 receives the airflow, the vehicular antenna device 1 may be attached such that the front-rear direction of the first space portion 31 does not coincide with the longitudinal direction of the vehicle to suppress the airflow from directly flowing into the first space.

In the above-described configuration, the second space portion 37 is located in a front part, and the heat generation member 42 and the heat dissipation member 43 are located in a rear-part. However, the positions in the front-rear direction may be swapped. That is, the heat generation member 42 and the heat dissipation member 43 may be located in the front part, and the second space portion 37 may be located in the rear part.

In the above-described configuration, the second space portion 37 is located in the first space, and the substrate connection portion 12 is accommodated in the second space to electrically connect the antenna element and the wireless communication circuit of the heat generation member 42. However, wiring may be provided outside the first space, and the antenna element and the wireless communication circuit of the heat generation member 42 may be electrically connected by the wiring. Further, the left side wall 28 or the right side wall 29 may be recessed to form a groove, and the groove may be used as the second space portion 37. It may be preferable that the recessed portion has a shape which is not likely to cause turbulence and does not hinder the compactification of the device as a whole, similarly to the second space portion 37.

In the above-described configuration, the antenna portion is the antenna substrate 6. However, the antenna element may have a pole shape. In the above-described configuration, the antenna substrate 6 is held by the first fixation member 5 and the second fixation member 7. However, the antenna substrate 6 may be held in any manner.

What is claimed is:
1. A vehicular antenna device configured to be attached to an attachment portion of a vehicle, the vehicular antenna device comprising:
   an antenna portion having an antenna element; and
   a frame accommodating a heat generation member, wherein
   the frame includes a first space portion having a cylindrical shape and defining a first space, the first space portion being exposed to an outside air in a condition where the vehicular antenna device is attached to the vehicle, the heat generation member is located along a second surface of the frame that is a reverse side of a first surface defining the first space, and the antenna portion is detachable from the frame.

2. The vehicular antenna device according to claim 1, further comprising:

a heat dissipation member located between the heat generation member and the second surface.

3. The vehicular antenna device according to claim 1, wherein the frame is covered with a body cover excepting the first space portion.

4. The vehicular antenna device according to claim 1, wherein the antenna portion is an antenna substrate having a flat plate shape, the antenna element is located on an opposite side of the first space opposite from the heat generation member, the heat generation member is mounted on a control board, the frame includes a second space portion configured to accommodate a substrate connection portion electrically connecting the antenna substrate and the control board, and the second space portion is located in the first space.

5. The vehicular antenna device according to claim 4, wherein the control board is accommodated in the frame.

6. The vehicular antenna device according to claim 4, wherein the frame includes an upper frame and a lower frame coupled with each other, the first space portion is a part of the upper frame, and the control board is accommodated in the lower frame.

* * * * *